(12) United States Patent
Kavala et al.

(10) Patent No.: US 11,367,471 B2
(45) Date of Patent: Jun. 21, 2022

(54) IMPEDANCE CALIBRATION CIRCUIT AND METHOD OF CALIBRATING IMPEDANCE IN MEMORY DEVICE

(71) Applicant: Samsung Electronics Co., Ltd., Suwon-si (KR)

(72) Inventors: Anil Kavala, Yongin-si (KR); Tongsung Kim, Seongnam-si (KR); Chiweon Yoon, Seoul (KR); Byunghoon Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/352,527

(22) Filed: Jun. 21, 2021

(65) Prior Publication Data

US 2022/0148630 A1    May 12, 2022

(30) Foreign Application Priority Data

Nov. 11, 2020    (KR) .................. 10-2020-0149935

(51) Int. Cl.
*G11C 7/10* (2006.01)
*H03K 19/00* (2006.01)
*H01L 27/115* (2017.01)
*G11C 16/04* (2006.01)

(52) U.S. Cl.
CPC ....... *G11C 7/1048* (2013.01); *H03K 19/0005* (2013.01); *G11C 16/0483* (2013.01); *H01L 27/115* (2013.01)

(58) Field of Classification Search
None
See application file for complete search history.

(56) References Cited

U.S. PATENT DOCUMENTS

| | | |
|---|---|---|
| 7,626,416 B2 | 12/2009 | Kim |
| 7,710,143 B2 | 5/2010 | Jeong et al. |
| 7,755,366 B2 | 7/2010 | Hosoe et al. |
| 8,036,846 B1 * | 10/2011 | Vullaganti ......... H03K 19/0005 702/104 |
| 9,264,039 B2 | 2/2016 | Seol et al. |

(Continued)

OTHER PUBLICATIONS

Churoo Park et al., "A 512-mb DDR3 SDRAM prototype with C/sub IO/ minimization and self-calibration techniques," IEEE Journal of Solid-State Circuits, Apr. 2006, pp. 831-838, vol. 41, No. 4.

*Primary Examiner* — Jany Richardson
(74) *Attorney, Agent, or Firm* — Muir Patent Law, PLLC

(57) ABSTRACT

An impedance calibration circuit includes a first variable impedance, a second variable impedance, a third variable impedance. The first variable impedance is connected to a ZQ terminal. A first control circuit performs a first impedance calibration on the first variable impedance based on an output signal from an output of a first comparator. A second control circuit performs a second impedance calibration on the third variable impedance based on an output signal from an output of a second comparator. A first switch connects an input of the first comparator to one of the ZQ terminal and the first node. A second switch connects the output of the first comparator to one of the first and second control circuits. A third switch connects an output of the first switch to one of first and second input terminals of the first comparator and connects the reference voltage to the other.

20 Claims, 19 Drawing Sheets

(56) References Cited

U.S. PATENT DOCUMENTS

| | | |
|---|---|---|
| 9,378,799 B2 | 6/2016 | Kaiwa et al. |
| 9,748,956 B2 | 8/2017 | Lee et al. |
| 10,348,270 B2 | 7/2019 | Gans |
| 10,693,436 B2 | 6/2020 | Kim et al. |
| 2012/0306543 A1 | 12/2012 | Matsuoka |
| 2016/0254812 A1* | 9/2016 | Miwa ................ H03K 19/0005 326/30 |
| 2021/0367597 A1* | 11/2021 | Michioka ........... H03K 19/0005 |

* cited by examiner

IMPEDANCE CALIBRATION CIRCUIT AND METHOD OF CALIBRATING IMPEDANCE IN MEMORY DEVICE

CROSS-REFERENCE TO RELATED APPLICATION

This application claims priority under 35 USC § 119 to Korean Patent Application No. 10-2020-0149935 filed on Nov. 11, 2020 in the Korean Intellectual Property Office (KIPO), the contents of which are herein incorporated by reference in their entirety.

BACKGROUND

1. Technical Field

Example embodiments relate to semiconductor integrated circuits, and more particularly to impedance calibration circuits, and methods of calibrating impedance in memory devices.

2. Description of the Related Art

As the operating speed of a memory device has increased, swing widths of signals interfaced between the memory device and a memory controller have decreased. A reason for the decrease of the swing widths is to minimize the time required to transmit the signals. However, as the swing widths have decreased, the signals transferred between the memory device and the memory controller may be more easily distorted by impedance mismatches caused by process, voltage and temperature (PVT) variations. An impedance calibration operation for adjusting an output impedance and/or a termination impedance of the memory device may be employed at transmitting and/or receiving stages of the memory device. In the impedance calibration operation, the output impedance and/or the termination impedance may be adjusted by comparing the output impedance and/or the termination impedance with an impedance of an external resistor. The impedance calibration operation may be referred to as an input/output (I/O) offset cancellation operation or a ZQ calibration operation.

SUMMARY

At least one example embodiment of the present disclosure provides an impedance calibration circuit included in a memory device and capable of compensating for an offset between a pull-up circuit and a pull-down circuit.

At least one example embodiment of the present disclosure provides a method of calibrating impedance using the impedance calibration circuit capable of compensating for the offset between the pull-up circuit and the pull-down circuit.

According to example embodiments, an impedance calibration circuit included in a memory device includes a first variable impedance circuit, a second variable impedance circuit, a third variable impedance circuit, a first comparator, a second comparator, a first control circuit, a second control circuit, a first switch circuit, a second switch circuit and a third switch circuit. The first variable impedance circuit is connected to a ZQ terminal. The second variable impedance circuit and the third variable impedance circuit are connected to a first node. The first comparator compares one of a voltage at the ZQ terminal and a voltage at the first node with a reference voltage. The second comparator compares the voltage at the first node with the reference voltage. The first control circuit performs a first impedance calibration operation on the first variable impedance circuit based on an output signal from an output of the first comparator. The second control circuit performs a second impedance calibration operation on the third variable impedance circuit based on an output signal from an output of the second comparator. The first switch circuit connects an input of the first comparator to one of the ZQ terminal and the first node. The second switch circuit connects the output of the first comparator to one of the first control circuit and the second control circuit. The third switch circuit connects an output of the first switch circuit to one of a first input terminal and a second input terminal of the first comparator and connects the reference voltage to the other.

According to example embodiments, in a method of calibrating impedance using an impedance calibration circuit that is included in a memory device and includes a first variable impedance circuit, a second variable impedance circuit, a third variable impedance circuit, a first comparator, a second comparator, a first control circuit and a second control circuit, a first impedance calibration operation and a second impedance calibration operation are simultaneously performed. The first impedance calibration operation is performed by the first comparator and the first control circuit on the first variable impedance circuit based on a voltage at a ZQ terminal and a reference voltage. The second impedance calibration operation is performed by the second comparator and the second control circuit on the third variable impedance circuit based on a voltage at a first node and the reference voltage. After the first impedance calibration operation and the second impedance calibration operation are completed, a third impedance calibration operation is performed using the first comparator and the second control circuit on the third variable impedance circuit based on the voltage at the first node and the reference voltage. After the third impedance calibration operation is completed, a fourth impedance calibration operation is performed using the first comparator and the first control circuit on the first variable impedance circuit based on the voltage at the ZQ terminal and the reference voltage.

According to example embodiments, an impedance calibration circuit included in a memory device includes a first variable impedance circuit, a second variable impedance circuit, a third variable impedance circuit, a first comparator, a second comparator, a first control circuit, a second control circuit, a first switch circuit, a second switch circuit, a third switch circuit, and a fourth switch circuit. The first variable impedance circuit is connected to a ZQ terminal. The second variable impedance circuit and the third variable impedance circuit are connected to a first node. The first comparator compares one of a voltage at the ZQ terminal and a voltage at the first node with a reference voltage. The second comparator compares the voltage at the first node with the reference voltage. The first control circuit performs a first impedance calibration operation on the first variable impedance circuit based on an output of the first comparator. The second control circuit performs a second impedance calibration operation on the third variable impedance circuit based on an output of the second comparator. The first switch circuit is connected to the ZQ terminal and the first node. The second switch circuit is connected to the output of the first comparator, the first control circuit, and the second control circuit. The third switch circuit connects an output of the first switch circuit to one of a first input terminal and a second input terminal of the first comparator and connects the reference voltage to the other. The fourth switch circuit is connected to the second comparator and the second control circuit. The first impedance calibration operation and the second impedance calibration operation are simultaneously performed, and a third impedance calibration operation on the third variable impedance circuit and a fourth impedance calibration operation on the first variable impedance circuit are sequentially performed after the first impedance calibration operation and the second impedance calibration operation are completed. In the first impedance calibration operation, the first switch circuit and the third switch circuit operate to connect the first input terminal and the second input terminal of the first comparator to the reference voltage and the ZQ terminal, respectively, the second switch circuit connects the output of the first comparator to the first control circuit, and the first control circuit changes a first impedance calibration code until the voltage at the ZQ terminal becomes equal to the reference voltage. In the second impedance calibration operation, a first input terminal and a second input terminal of the second comparator are connected to the reference voltage and the first node, respectively, the fourth switch circuit connects the output of the second comparator to the second control circuit, and the second control circuit changes a second impedance calibration code until the voltage at the first node becomes equal to the reference voltage. In the third impedance calibration operation, the first switch circuit and the third switch circuit operate to connect the first input terminal and the second input terminal of the first comparator to the reference voltage and the first node, respectively, the second switch circuit inverts an output signal from the output of the first comparator and provides the inverted output signal of the first comparator to the second control circuit, and the second control circuit changes the second impedance calibration code until the voltage at the first node becomes equal to the reference voltage. In the fourth impedance calibration operation, the first switch circuit and the third switch circuit operate to connect the first input terminal and the second input terminal of the first comparator to the ZQ terminal and the reference voltage, respectively, the second switch circuit connects the output of the first comparator to the first control circuit, and the first control circuit changes a third impedance calibration code until the voltage at the ZQ terminal becomes equal to the reference voltage. The first control circuit further generates a final impedance calibration code by averaging the first impedance calibration code and the third impedance calibration code, and an impedance of the first variable impedance circuit is determined based on the final impedance calibration code.

The impedance calibration circuit according to example embodiments may include the first and second switch circuits for changing the input and output of the first comparator, and thus an additional impedance calibration operation may be performed on the third variable impedance circuit using the first comparator and the second control circuit. In addition, the impedance calibration circuit according to example embodiments may include the third switch circuit for swapping two input terminals of the first comparator, and thus the additional impedance calibration operation may be performed on the first variable impedance circuit using the first comparator and the first control circuit. Accordingly, as compared to a conventional impedance calibration circuit, the impedance calibration circuit may have a relatively simple structure and short locking time, may efficiently cancel the comparator random offset, and may perform the impedance calibration operation with relatively improved or enhanced performance. The memory device including the impedance calibration circuit may have relatively improved or enhanced signal integrity.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
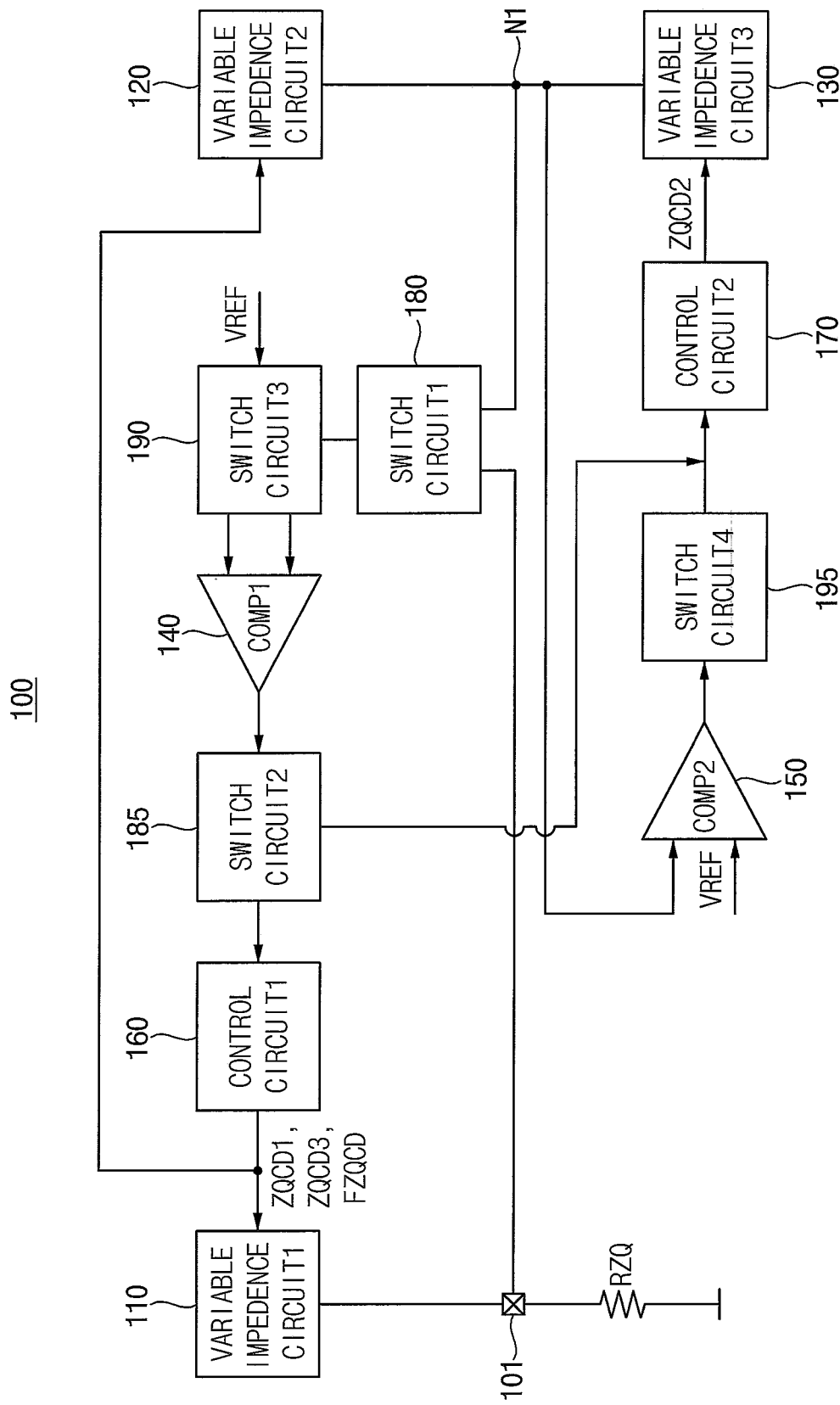
FIG. 1 is a block diagram illustrating an impedance calibration circuit included in a memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating an impedance calibration circuit included in a memory device according to example embodiments.

Referring to FIG. 1, an impedance calibration circuit 100 includes a first variable impedance circuit 110, a second variable impedance circuit 120, a third variable impedance circuit 130, a first comparator 140, a second comparator 150, a first control circuit 160, a second control circuit 170, a first switch circuit 180, a second switch circuit 185 and a third switch circuit 190. The impedance calibration circuit 100 may further include a fourth switch circuit 195.

The first variable impedance circuit 110 is connected to a ZQ terminal 101. The ZQ terminal 101 may be connected to an external resistor RZQ. Each of the second variable impedance circuit 120 and the third variable impedance circuit 130 is connected to a first node N1.

Each of the first, second and third variable impedance circuits 110, 120 and 130 may have a variable impedance (or a variable impedance value). For example, each of the first and second variable impedance circuits 110 and 120 may have an impedance that is set, adjusted and/or changed based on impedance calibration codes ZQCD1, ZQCD3 and FZQCD, and the third variable impedance circuit 130 may have an impedance that is set, adjusted and/or changed based on an impedance calibration code ZQCD2. The impedances of the first and second variable impedance circuits 110 and 120 may be set and changed to be substantially equal to each other. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In some example embodiments, the first and second variable impedance circuits 110 and 120 may be circuits of the same type, and the third variable impedance circuit 130 may be a circuit of different types from the first and second variable impedance circuits 110 and 120. For example, as will be described with reference to FIG. 2, each of the first and second variable impedance circuits 110 and 120 may be a pull-up circuit, and the third variable impedance circuit 130 may be a pull-down circuit. The present inventive concept is not limited thereto. For example, as will be described with reference to FIG. 7, each of first and second variable impedance circuits 310 and 320 may be a pull-down circuit, and a third variable impedance circuit 330 may be a pull-up circuit.

The first comparator 140 compares one of a voltage at the ZQ terminal 101 and a voltage at the first node N1 with a reference voltage VREF. The first control circuit 160 performs a first impedance calibration operation on the first variable impedance circuit 110 based on an output of the first comparator 140, e.g., based on a result of comparing one of the voltage at the ZQ terminal 101 and the voltage at the first node N1 with the reference voltage VREF. In an embodiment, the first control circuit 160 may perform, in response to a first impedance control signal, the first impedance calibration operation on the first variable impedance circuit 110.

The second comparator 150 compares the voltage at the first node N1 with the reference voltage VREF. The second control circuit 170 performs a second impedance calibration operation on the third variable impedance circuit 130 based on an output of the second comparator 150, e.g., based on a result of comparing the voltage at the first node N1 with the reference voltage VREF. In an embodiment, the second control circuit 170 may perform, in response to a second impedance control signal, the second impedance calibration operation on the third variable impedance circuit 130.

In some example embodiments, the first impedance calibration operation and the second impedance calibration operation may be substantially simultaneously or concurrently performed. For example, the first and second control circuits 160 and 170 may substantially simultaneously or concurrently perform the first and second impedance calibration operations.

The first switch circuit 180 connects an input of the first comparator 140 to one of the ZQ terminal 101 and the first node N1. The second switch circuit 185 connects the output of the first comparator 140 to one of the first control circuit 160 and the second control circuit 170.

In some example embodiments, an additional impedance calibration operation may be performed on the third variable impedance circuit 130 using the first and second switch circuits 180 and 185. For example, the input of the first comparator 140 may be connected to the ZQ terminal 101 using the first switch circuit 180, the output of the first comparator 140 may be connected to the first control circuit 160 using the second switch circuit 185, and then the first impedance calibration operation may be performed using the first comparator 140 and the first control circuit 160. The second impedance calibration operation may be performed using the second comparator 150 and the second control circuit 170. After the first and second impedance calibration operations are completed, the input of the first comparator 140 may be connected to the first node N1 using the first switch circuit 180, the output of the first comparator 140 may be connected to the second control circuit 170 using the second switch circuit 185, and then a third impedance calibration operation may be additionally performed on the third variable impedance circuit 130 using the first comparator 140 and the second control circuit 170.

The fourth switch circuit 195 may selectively connect the output of the second comparator 150 to the second control circuit 170. For example, while the second impedance calibration operation is performed, the output of the second comparator 150 and the second control circuit 170 may be connected to each other by the fourth switch circuit 195. In an embodiment, the fourth switch circuit 195 may, in response to the second impedance control signal, may connect the second comparator 150 to the second control circuit 170. For example, while the third impedance calibration operation is performed, the output of the second comparator 150 and the second control circuit 170 may be disconnected to each other by the fourth switch circuit 195. In an embodiment, the fourth switch circuit 195 may be set such that the second comparator 150 is disconnected from the second control circuit 170, and in response to the second impedance control signal (e.g., during a time when the second impedance control signal is active), the second comparator 150 is connected to the second control circuit 170. The present inventive concept is not limited thereto. In an embodiment, the fourth switch circuit 195, in response to the second impedance control signal, connects the second comparator 150 to the second control circuit 170, and in response to a third impedance control signal, disconnects the second comparator 150 from the second control circuit 170.

The third switch circuit 190 swaps (i.e., changes connections of) a first input terminal and a second input terminal of the first comparator 140 to a first signal (e.g., an output signal of the first switch circuit 180) and a second signal (e.g., the reference voltage VREF). For example, the third switch circuit 190, in response to the first impedance control signal, may operate to receive the first and second signals such that the first signal is applied to the first input terminal of the first comparator 140 and the second signal is applied to the second input terminal of the first comparator 140. For example, the third switch circuit 190, in response to a fourth impedance control signal, may operate to receive the first and second signals such that the second signal is applied to the first input terminal of the first comparator 140 and the first signal is applied to the second input terminal of the first comparator 140.

In some example embodiments, an additional impedance calibration operation may be performed on the first variable impedance circuit 110 using the third switch circuit 190. For example, the first input terminal of the first comparator 140 may be connected to the reference voltage VREF and the second input terminal of the first comparator 140 may be connected to the ZQ terminal 101 using the third switch circuit 190, and then the first impedance calibration operation may be performed using the first comparator 140 and the first control circuit 160. In addition, as described above, the second impedance calibration operation may be performed using the second comparator 150 and the second control circuit 170. After the first and second impedance calibration operations are completed, the first input terminal of the first comparator 140 may be connected to the ZQ terminal 101 and the second input terminal of the first comparator 140 may be connected to the reference voltage VREF using the third switch circuit 190, and then a fourth impedance calibration operation may be performed on the first variable impedance circuit 110 using the first comparator 140 and the first control circuit 160.

In some example embodiments, the fourth impedance calibration operation may be performed after the third impedance calibration operation is completed.

In some example embodiments, the impedance calibration circuit 100 may be included in a memory device. For example, the memory device may include or may be any nonvolatile memory device, and a configuration of the nonvolatile memory device will be described with reference to FIGS. 12, 13 and 14. However, example embodiments are not limited thereto, and the memory device may include or may be any volatile memory device.

An impedance calibration operation refers to an operation in which an output impedance and/or a termination impedance of a data input/output (I/O) terminal of a memory device is controlled or adjusted using an external resistor such that the output impedance and/or the termination impedance is maintained at a constant value regardless of process, voltage and temperature (PVT) variations.

If a pull-up impedance calibration operation and a pull-down impedance calibration operation are performed using different comparators, a comparator random offset occurs due to the mismatch between the comparators, and a pull-up impedance and a pull-down impedance are not exactly equal to each other, and thus the performance of the impedance calibration operation is degraded.

The impedance calibration circuit 100 according to example embodiments may include the first and second switch circuits 180 and 185 for changing the input and output of the first comparator 140, and thus the additional impedance calibration operation may be performed on the third variable impedance circuit 130 using the first comparator 140 and the second control circuit 170. The impedance calibration circuit 100 according to example embodiments may include the third switch circuit 190 for changing connections of two input terminals of the first comparator 140 to input signals, and thus the additional impedance calibration operation may be performed on the first variable impedance circuit 110 using the first comparator 140 and the first control circuit 160. Accordingly, as compared to a conventional impedance calibration circuit, the impedance calibration circuit 100 may have a relatively simple structure and short locking time, may efficiently cancel the comparator random offset, and may perform the impedance calibration operation with relatively improved or enhanced performance. The memory device including the impedance calibration circuit 100 may have relatively improved or enhanced signal integrity.

Figure 2:
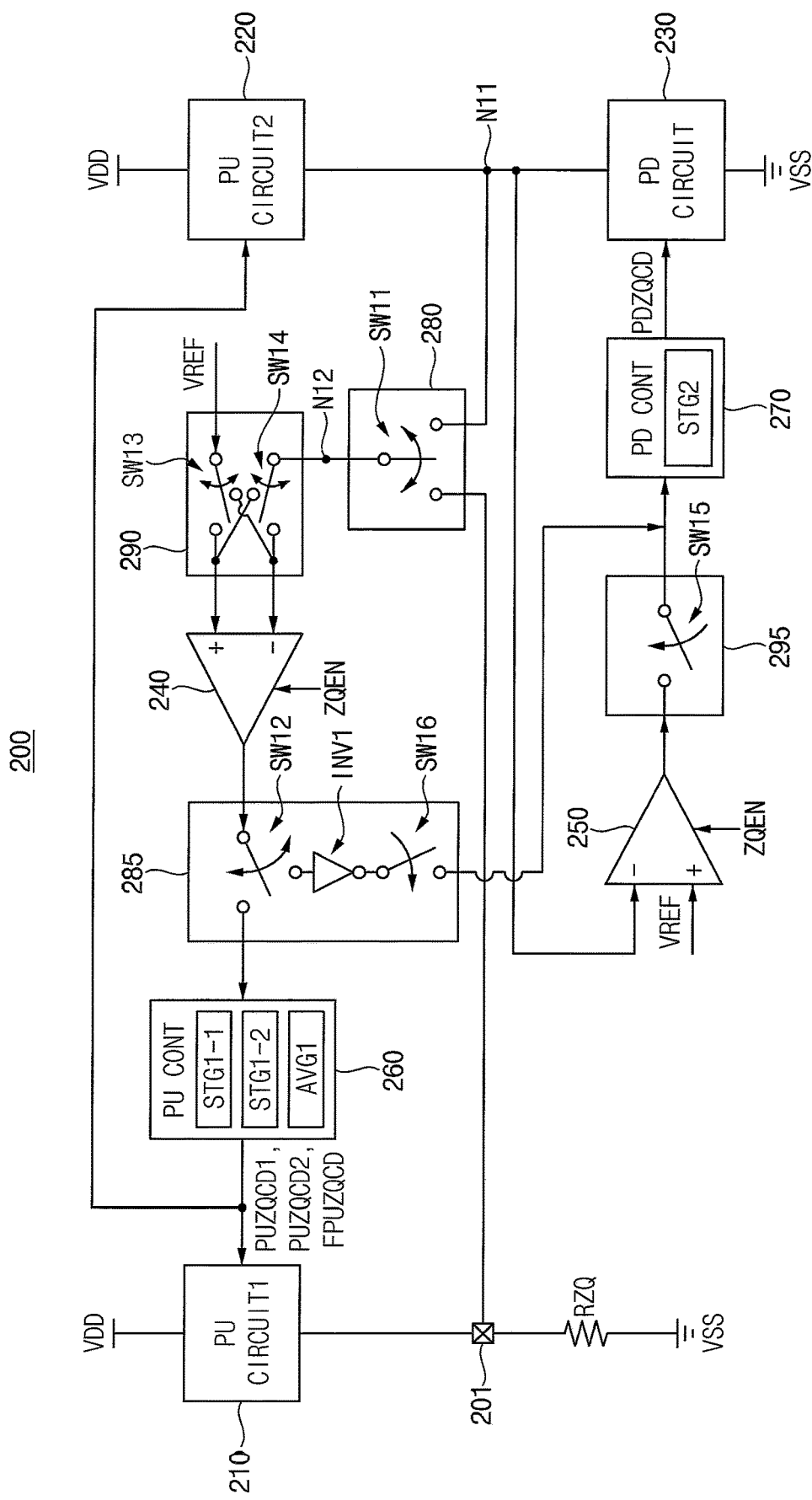
FIG. 2 is a block diagram illustrating an example of an impedance calibration circuit of FIG. 1.

FIG. 2 is a block diagram illustrating an example of an impedance calibration circuit of FIG. 1.

Referring to FIG. 2, an impedance calibration circuit 200 may include a first pull-up (PU) circuit 210, a second pull-up circuit 220, a pull-down (PD) circuit 230, a first comparator 240, a second comparator 250, a pull-up control circuit 260, a pull-down control circuit 270, a first switch circuit 280, a second switch circuit 285, a third switch circuit 290 and a fourth switch circuit 295.

FIG. 2 illustrates an example where each of the first and second variable impedance circuits 110 and 120 in FIG. 1 is implemented as a pull-up circuit and the third variable impedance circuit 130 in FIG. 1 is implemented as a pull-down circuit. The first control circuit 160 and the second control circuit 170 in FIG. 1 may correspond to the pull-up control circuit 260 and the pull-down control circuit 270, respectively.

The first pull-up circuit 210 may be connected between a power supply voltage VDD and a ZQ terminal 201, and an external resistor RZQ may be connected between the ZQ terminal 201 and a ground voltage VSS. The second pull-up circuit 220 may be connected between the power supply voltage VDD and a first node N11, and the pull-down circuit 230 may be connected between the first node N11 and the ground voltage VSS. In other words, the first pull-up circuit 210 and the external resistor RZQ may be connected in series between the power supply voltage VDD and the ground voltage VSS, and the second pull-up circuit 220 and the pull-down circuit 230 may be connected in series between the power supply voltage VDD and the ground voltage VSS.

The first switch circuit 280 may connect one of the ZQ terminal 201 and the first node N11 to a second node N12. For example, the first switch circuit 280 may include a switch SW11.

The third switch circuit 290 may connect a reference voltage VREF and the second node N12 to a first input terminal (+) and a second input terminal (−) of the first comparator 240, respectively. For example, the third switch circuit 290 may include switches SW13 and SW14.

The first comparator 240 may compare a voltage at the ZQ terminal 201 with the reference voltage VREF or may compare a voltage at the first node N11 with the reference voltage VREF, based on an impedance calibration enable signal ZQEN and depending on connection states of the first and third switch circuits 280 and 290. For example, a level of the reference voltage VREF may be substantially equal to a half of a level of the power supply voltage VDD (e.g., VREF=VDD/2).

The second switch circuit 285 may provide an output of the first comparator 240 to the pull-up control circuit 260 or to the pull-down control circuit 270. For example, the second switch circuit 285 may include switches SW12 and SW16 and an inverter INV1.

The pull-up control circuit 260 may perform an impedance calibration operation on the first pull-up circuit 210 based on the output of the first comparator 240, and may generate a first pull-up impedance calibration code PUZQCD1, a second pull-up impedance calibration code PUZQCD2 and a final pull-up impedance calibration code FPUZQCD.

The pull-up control circuit 260 may include a first storage unit STG1-1 (i.e., a first storage circuit), a second storage unit STG1-2 (i.e., a second storage circuit) and an averaging unit AVG1 (i.e., an averaging circuit). The first storage unit STG1-1 may store the first pull-up impedance calibration code PUZQCD1. The second storage unit STG1-2 may store the second pull-up impedance calibration code PUZQCD2. The averaging unit AVG1 may generate a final pull-up impedance calibration code FPUZQCD based on the first and second pull-up impedance calibration codes PUZQCD1 and PUZQCD2. For example, each of the first and second storage units STG1-1 and STG1-2 may include a register, a latch, or the like, and the averaging unit AVG1 may include an adder.

The second comparator 250 may include a first input terminal (+) receiving the reference voltage VREF and a second input terminal (−) connected to the first node N11, and may compare the voltage at the first node N11 with the reference voltage VREF based on the impedance calibration enable signal ZQEN.

The fourth switch circuit 295 may selectively provide an output of the second comparator 250 to the pull-down control circuit 270. For example, the fourth switch circuit 295 may include a switch SW15. For example, the switch SW15 may be a single-pole single-throw (SPST) switch, and may include one transistor or one transmission gate.

The pull-down control circuit 270 may perform an impedance calibration operation on the pull-down circuit 230 based on the output of the second comparator 250 or based on the output of the first comparator 240, and may generate a pull-down impedance calibration code PDZQCD.

The pull-down control circuit 270 may include a storage unit STG2. The storage unit STG2 may store the pull-down impedance calibration code PDZQCD. For example, the storage unit STG2 may include a register, a latch, or the like.

Although not illustrated in FIG. 2, each of the pull-up control circuit 260 and the pull-down control circuit 270 may further include an up-down counter, a counter filter, control logic, or the like, for performing the impedance calibration operation.

Although FIG. 2 illustrates that each of the switches SW11, SW12, SW13 and SW14 is a single-pole double-throw (SPDT) switch, example embodiments are not limited thereto, and each of the switches SW11, SW12, SW13 and SW14 may include two transistors or two transmission gates. Although FIG. 2 illustrates that the fourth switch circuit 295 includes two SPDT switches, example embodiments are not limited thereto, and the fourth switch circuit 295 may include one double-pole double-throw (DPDT) switch.

In some example embodiments, the switches SW11, SW12, SW13, SW14, SW15 and SW16 included in the switch circuits 280, 285, 290 and 295 may operate based on switch control signals received from the outside. For example, the switch control signals may be provided from an external control circuit (e.g., a control circuit 560 in FIG. 12). In an embodiment, the switch control signals may include the first to fourth impedance control signals associated with the first to fourth impedance calibration operations, respectively.

Figure 3A:
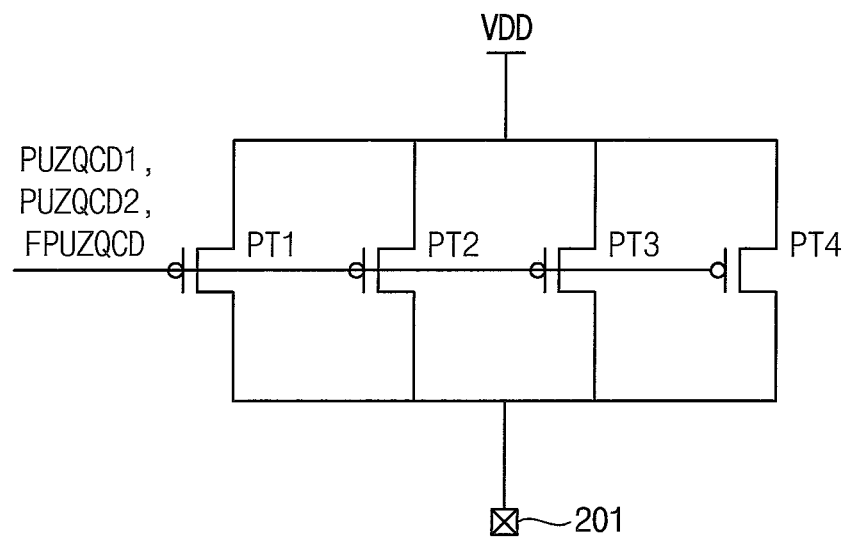
FIGS. 3A and 3B are circuit diagrams illustrating an example of a pull-up circuit and a pull-down circuit included in an impedance calibration circuit of FIG. 2.
Figure 3B:
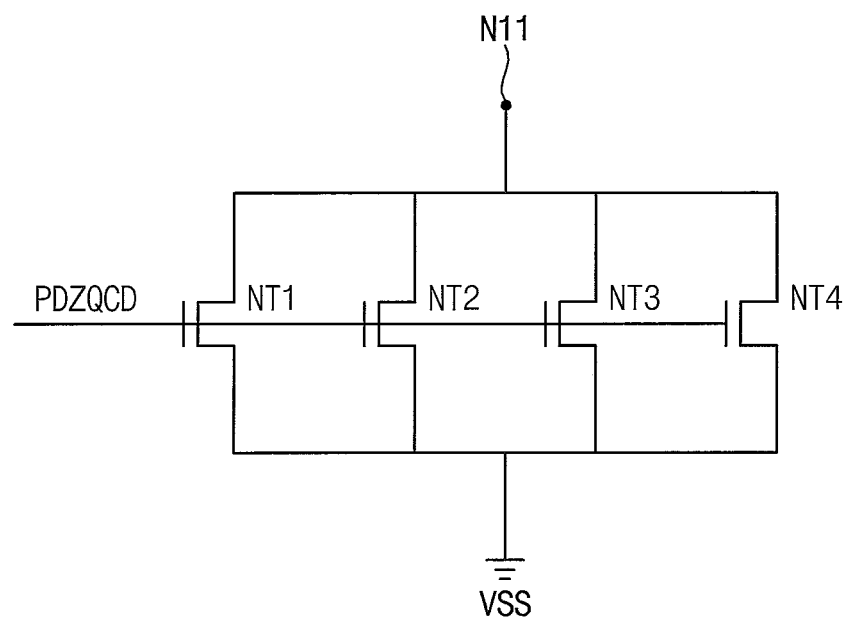

FIGS. 3A and 3B are circuit diagrams illustrating an example of a pull-up circuit and a pull-down circuit included in an impedance calibration circuit of FIG. 2.

Referring to FIG. 3A, a pull-up circuit may include a plurality of p-type metal oxide semiconductor (PMOS) transistors PT1, PT2, PT3 and PT4. FIG. 3A illustrates an example of the first pull-up circuit 210 in FIG. 2.

The plurality of PMOS transistors PT1, PT2, PT3 and PT4 may be connected in parallel between the power supply voltage VDD and the ZQ terminal 201, and may have gate electrodes receiving the pull-up impedance calibration codes PUZQCD1, PUZQCD2 and FPUZQCD. For example, the gate electrode of each PMOS transistor may receive one bit of each pull-up impedance calibration code.

At least a part or some of the plurality of PMOS transistors PT1, PT2, PT3 and PT4 may be turned on based on the pull-up impedance calibration codes PUZQCD1, PUZQCD2 and FPUZQCD, and an impedance of the pull-up circuit may be set and changed depending on the number and type of the PMOS transistors PT1, PT2, PT3 and PT4 being turned on.

In some example embodiments, all of the PMOS transistors PT1, PT2, PT3 and PT4 may have the same size and the same impedance. In some example embodiments, at least one of the PMOS transistors PT1, PT2, PT3 and PT4 may have different sizes and different impedances.

Although not illustrated in FIG. 3A, the second pull-up circuit 220 in FIG. 2 may have a configuration substantially the same as that illustrated in FIG. 3A.

Referring to FIG. 3B, a pull-down circuit may include a plurality of n-type metal oxide semiconductor (NMOS) transistors NT1, NT2, NT3 and NT4. FIG. 3B illustrates an example of the pull-down circuit 230 in FIG. 2. The descriptions repeated with FIG. 3A will be omitted.

The plurality of NMOS transistors NT1, NT2, NT3 and NT4 may be connected in parallel between the first node N11 and the ground voltage VSS, and may have gate electrodes receiving the pull-down impedance calibration code PDZQCD. At least a part or some of the NMOS transistors NT1, NT2, NT3 and NT4 may be turned on based on the pull-down impedance calibration code PDZQCD, and an impedance of the pull-down circuit may be set and changed depending on the number and type of the NMOS transistors NT1, NT2, NT3 and NT4 being turned on.

FIGS. 4A, 4B, 4C and 4D are diagrams for describing an operation of an impedance calibration circuit of FIG. 2.

Figure 4A:
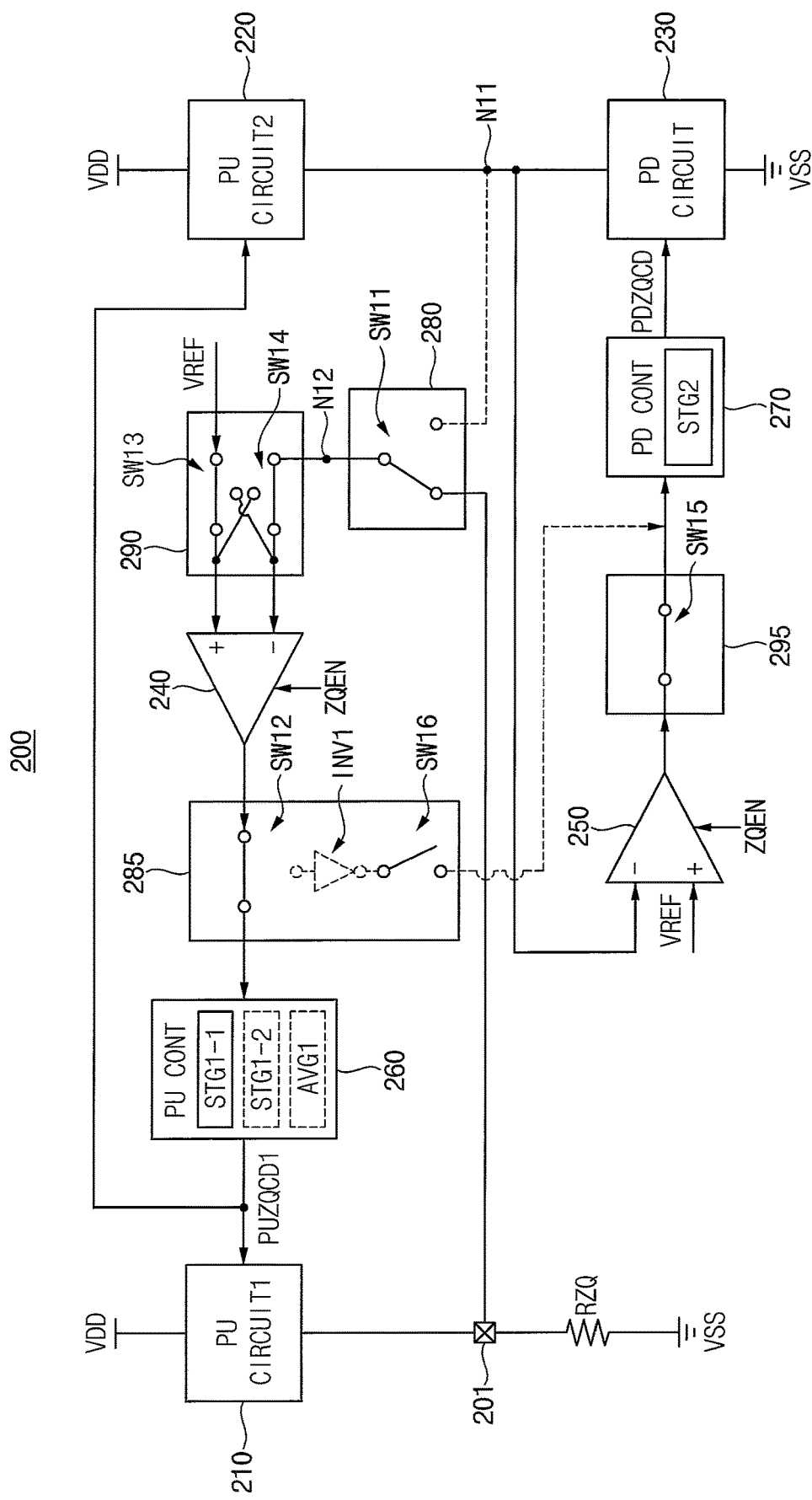
FIGS. 4A, 4B, 4C and 4D are diagrams for describing an operation of an impedance calibration circuit of FIG. 2.

Referring to FIG. 4A, a first impedance calibration operation may be performed on the first pull-up circuit 210 using the first comparator 240 and the pull-up control circuit 260, and a second impedance calibration operation may be performed on the pull-down circuit 230 using the second comparator 250 and the pull-down control circuit 270. The first and second impedance calibration operations may be substantially simultaneously performed.

When the first impedance calibration operation is performed, the second node N12 corresponding to an input of the first comparator 240 may be connected to the ZQ terminal 201 using the first switch circuit 280, the output of the first comparator 240 may be connected to the pull-up control circuit 260 using the second switch circuit 285, and the first input terminal (+) of the first comparator 240 may be connected to the reference voltage (VREF) and the second input terminal (−) of the first comparator 240 may be connected to the second node N12 (e.g., connected to the ZQ terminal 201) using the third switch circuit 290. Thus, a path between the first node N11 and the input of the first comparator 240 and a path between the output of the first comparator 240 and the pull-down control circuit 270 may be disabled or deactivated. In FIG. 4A and following figures, disabled paths and/or disabled components are illustrated by dotted lines.

The first pull-up circuit 210 and the pull-up control circuit 260 may perform the first impedance calibration operation based on the output of the first comparator 240. For example, the pull-up control circuit 260 may control the first pull-up impedance calibration code PUZQCD1 based on the output of the first comparator 240, and an impedance of the first pull-up circuit 210 may be adjusted based on the first pull-up impedance calibration code PUZQCD1. For example, a value of the first pull-up impedance calibration code PUZQCD1 may be changed until the voltage at the ZQ terminal 201 becomes substantially equal to the reference voltage VREF. When the voltage at the ZQ terminal 201 and the reference voltage VREF are substantially equal to each other, the pull-up control circuit 260 may determine that the first impedance calibration operation is completed, and the value of the first pull-up impedance calibration code PUZQCD1 at a time when the voltage at the ZQ terminal 201 becomes substantially equal to the reference voltage VREF may be stored in the first storage unit STG1-1. The impedance of the first pull-up circuit 210 and an impedance of the second pull-up circuit 220 may be set based on the first pull-up impedance calibration code PUZQCD1 stored in the first storage unit STG1-1. The pull-up control circuit 260 may further include a control logic circuit which monitors the output of the first comparator 240, and based on the monitored output, determines the value of the first pull-up impedance calibration code PUZQCD1 to be stored in the first storage unit STG1-1.

After the first impedance calibration operation is completed (i.e., when the voltage at the ZQ terminal 201 and the reference voltage VREF are equal to each other), the impedances of the first and second pull-up circuits 210 and 220 are not completely or exactly equal to a resistance of the external resistor RZQ, due to the mismatch and/or offset between the first input terminal (+) and the second input terminal (−) of the first comparator 240. For example, when the resistance of the external resistance RZQ is about 300 ohms (9), the impedance of each of the first and second pull-up circuits 210 and 220 may be about 290 to 310 ohms. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

When the second impedance calibration operation is performed, the output of the second comparator 250 may be connected to the pull-down control circuit 270 using the fourth switch circuit 295.

The pull-down circuit 230 and the pull-down control circuit 270 may perform the second impedance calibration operation based on the output of the second comparator 250. For example, the pull-down control circuit 270 may control the pull-down impedance calibration code PDZQCD based on the output of the second comparator 250, and an impedance of the pull-down circuit 230 may be adjusted based on the pull-down impedance calibration code PDZQCD. For example, a value of the pull-down impedance calibration code PDZQCD may be changed until the voltage at the first node N11 becomes substantially equal to and the reference voltage VREF. When the voltage at the first node N11 and the reference voltage VREF are substantially equal to each other, the pull-down control circuit 270 may determine that the second impedance calibration operation is completed, and the value of the pull-down impedance calibration code PDZQCD at a time when the voltage at the first node N11 becomes substantially equal to the reference voltage VREF may be stored in the storage unit STG2. An impedance of the pull-down circuit 230 may be set based on the pull-down impedance calibration code PDZQCD stored in the storage unit STG2. The pull-down control circuit 270 may further include a control logic circuit which monitors the output of the second comparator 250, and based on the monitored output, determines the value of the pull-down impedance calibration code PDZQCD to be stored in the storage unit STG2.

After the second impedance calibration operation is completed (i.e., when the voltage at the first node N11 and the reference voltage VREF are equal to each other), the impedance of the pull-down circuit 230 is not completely or exactly equal to the resistance of the external resistor RZQ and the impedances of the first and second pull-up circuits 210 and 220, due to the mismatch and/or offset between the first input terminal (+) and the second input terminal (−) of the second comparator 250, and due to the mismatch and/or offset between the first comparator 240 and the second comparator 250. For example, when the resistance of the external resistance RZQ is about 300 ohms, and when the impedance of each of the first and second pull-up circuits 210 and 220 is about 290 to 310 ohms, the impedance of the pull-down circuit 230 may be about 280 to 320 ohms.

An additional impedance calibration operation may be performed to cancel or remove the above-described mismatch and/or offset.

Figure 4B:
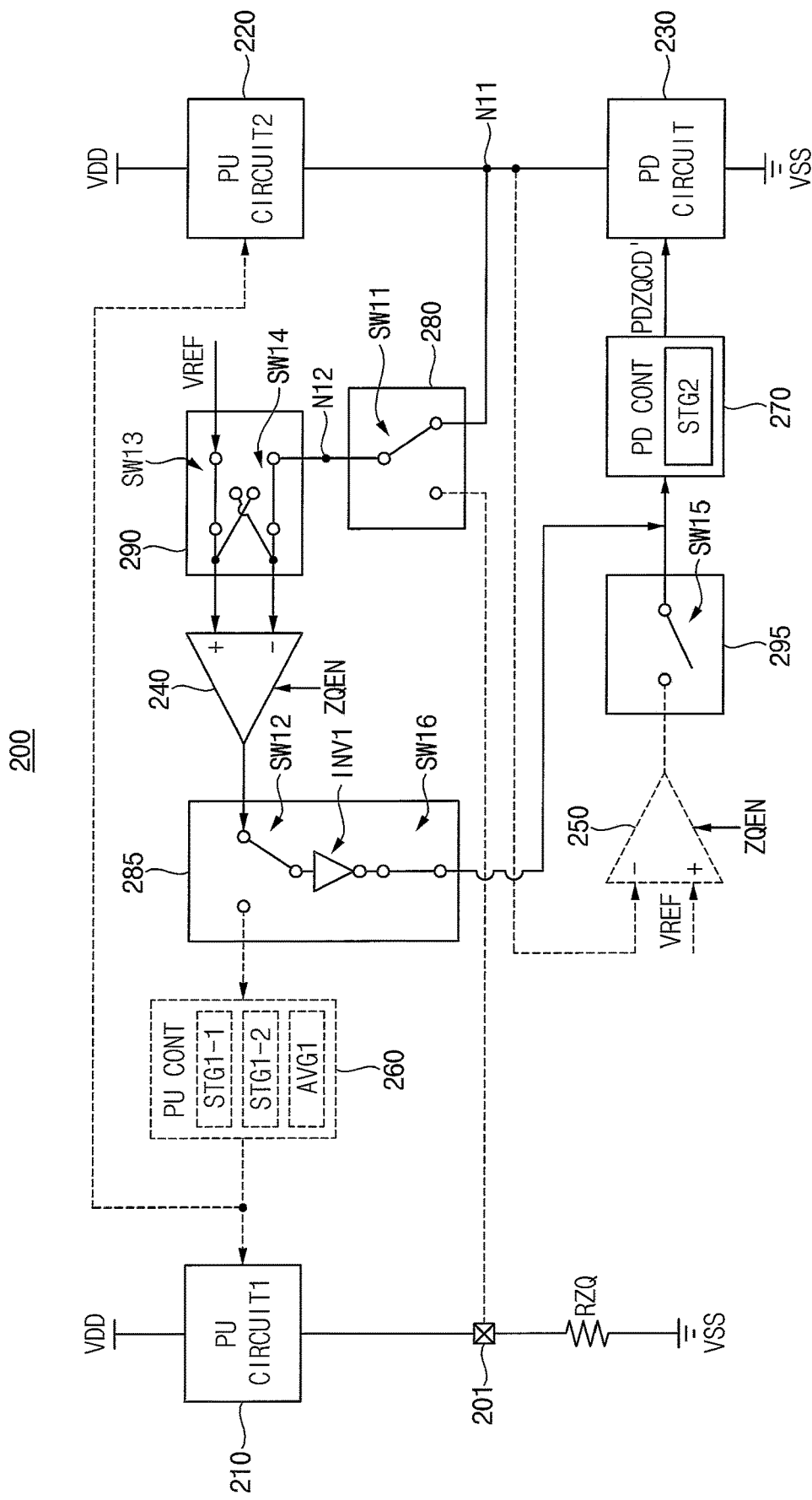

Referring to FIG. 4B, after the first and second impedance calibration operations are completed, a third impedance calibration operation may be additionally performed on the pull-down circuit 230 using the first comparator 240 and the pull-down control circuit 270. The third impedance calibration operation may be referred to as a fine calibration operation or a locking operation.

When the third impedance calibration operation is performed, the second node N12 may be connected to the first node N11 using the first switch circuit 280, the output of the first comparator 240 may be connected to the pull-down control circuit 270 using the second switch circuit 285, and the first input terminal (+) of the first comparator 240 may be connected to the reference voltage VREF and the second input terminal (−) of the first comparator 240 may be connected to the second node N12 (e.g., connected to the first node N11) using the third switch circuit 290. The connection between the output of the second comparator 250 and the pull-down control circuit 270 may be disconnected using the fourth switch circuit 295. Thus, a path between the ZQ terminal 201 and the first comparator 240 and a path between the output of the first comparator 240 and the pull-up control circuit 260 may be disabled. In the third impedance calibration operation, the pull-up control circuit 260 may be disabled, the impedance calibration operation is not performed on the first pull-up circuit 210 by the pull-up control circuit 260, and the second comparator 250 may also be disabled.

The pull-down circuit 230 and the pull-down control circuit 270 may perform the third impedance calibration operation based on the output of the first comparator 240. For example, the pull-down control circuit 270 may control a pull-down impedance calibration code PDZQCD' based on an inverted output of the first comparator 240 that is obtained by inverting the output of the first comparator 240, and the impedance of the pull-down circuit 230 may be adjusted based on the pull-down impedance calibration code PDZQCD'. For example, an initial value of the pull-down impedance calibration code PDZQCD' may be substantially equal to the value of the pull-down impedance calibration code PDZQCD stored in the storage unit STG2 after the second impedance calibration operation of FIG. 4A is completed. In the third impedance calibration operation, the value of the pull-down impedance calibration code PDZQCD' may be changed until the voltage at the first node N11 becomes substantially equal to the reference voltage VREF. When the voltage at the first node N11 and the reference voltage VREF are substantially equal to each other, the pull-down control circuit 270 may determine that the third impedance calibration operation is completed, and a value of the pull-down impedance calibration code PDZQCD' at a time when the voltage at the first node N11 becomes substantially equal to the reference voltage VREF may be stored in the storage unit STG2. The impedance of the pull-down circuit 230 may be set based on the pull-down impedance calibration code PDZQCD' stored in the storage unit STG2. The pull-down control circuit 270 may further include a control logic circuit which monitors the output of the first comparator 240, and based on the monitored output, determines the value of the pull-down impedance calibration code PDZQCD' to be stored in the storage unit STG2.

When the third impedance calibration operation is performed using the first comparator 240 that is the same as used in the first impedance calibration operation, the above-described mismatch and/or offset caused by different comparators may be canceled, and thus the impedance of the pull-down circuit 230 may be set to be substantially equal to the resistance of the external resistor RZQ. For example, when the resistance of the external resistance RZQ is about 300 ohms, the impedance of the pull-down circuit 230 may also be about 300 ohms.

Figure 4C:
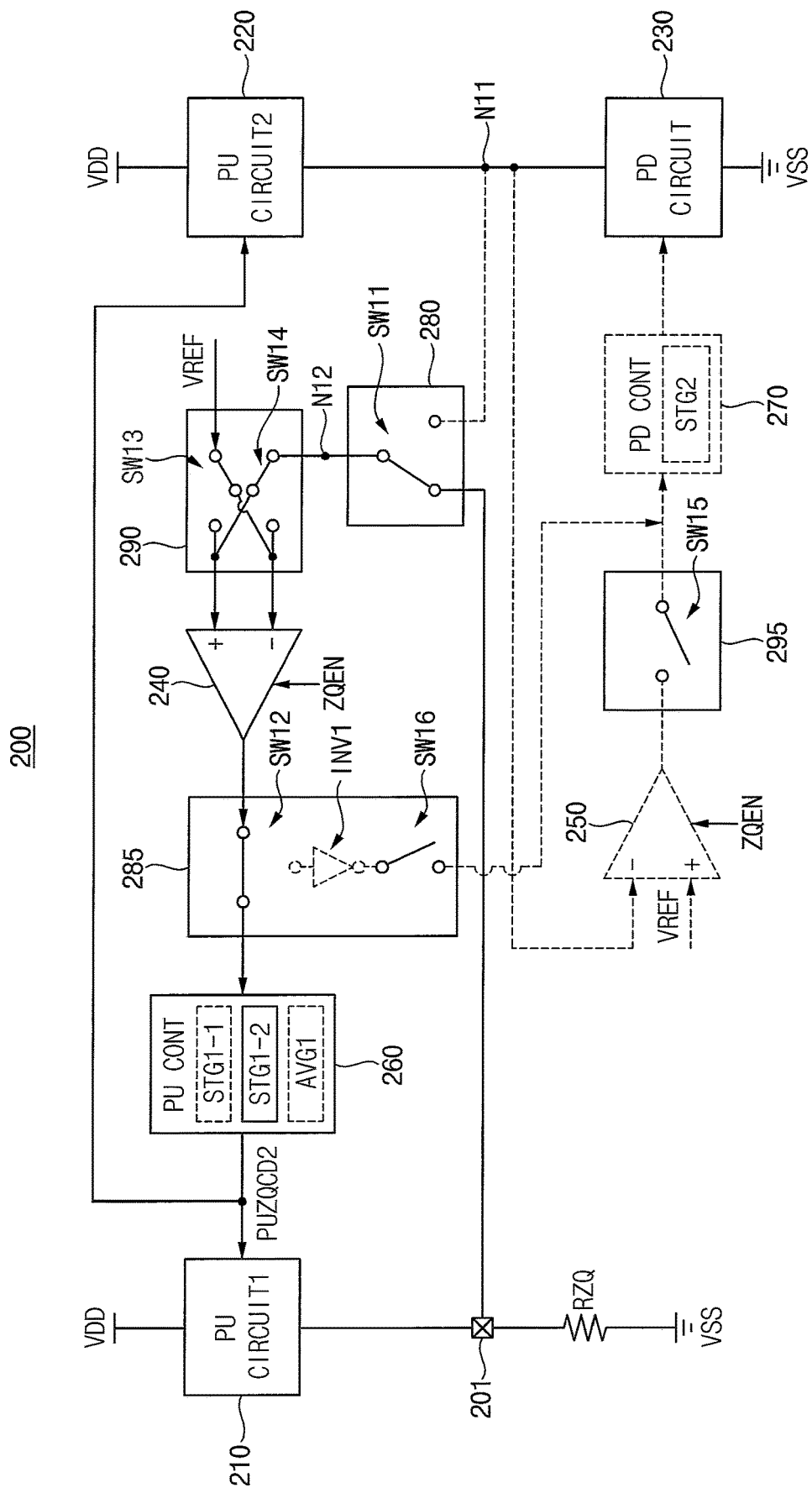

Referring to FIG. 4C, after the third impedance calibration operation is completed, a fourth impedance calibration operation may be additionally performed on the first pull-up circuit 210 and the second pull-up circuit 220 using the first comparator 240 and the pull-up control circuit 260. The fourth impedance calibration operation may also be referred to as a fine calibration operation or a locking operation.

When the fourth impedance calibration operation is performed, the second node N12 may be connected to the ZQ terminal 201 using the first switch circuit 280, the output of the first comparator 240 may be connected to the pull-up control circuit 260 using the second switch circuit 285, and the first input terminal (+) of the first comparator 240 may be connected to the second node N12 (e.g., connected to the ZQ terminal 201) and the second input terminal (−) of the first comparator 240 may be connected to the reference voltage VREF using the third switch circuit 290. For example, the connections of the first input terminal (+) and the second input terminal (−) of the first comparator 240 may be changed such that the first input terminal (+) and the second input terminal (−) of the first comparator 240 are connected to the second node N12 and the reference voltage VREF, respectively. In the fourth impedance calibration operation, the connection between the output of the second comparator 250 and the pull-down control circuit 270 may be disconnected using the fourth switch circuit 295. Thus, the path between the first node N11 and the input of the first comparator 240 and the path between the output of the first comparator 240 and the pull-down control circuit 270 may be disabled. Further, the second comparator 250 and the pull-down control circuit 270 may be disabled, and the impedance calibration operation by the pull-down control circuit 270 may not be performed on the pull-down circuit 230.

The first pull-up circuit 210 and the pull-up control circuit 260 may perform the fourth impedance calibration operation based on the output of the first comparator 240. For example, the pull-up control circuit 260 may control the second pull-up impedance calibration code PUZQCD2 based on the output of the first comparator 240, and the impedance of the first pull-up circuit 210 may be adjusted based on the second pull-up impedance calibration code PUZQCD2. In the fourth impedance calibration operation, the value of the second pull-up impedance calibration code PUZQCD2 may be changed until the voltage at the ZQ terminal becomes substantially equal to the reference voltage VREF. When the voltage at the ZQ terminal 201 and the reference voltage VREF are substantially equal to each other, the pull-up control circuit 260 may determine that the fourth impedance calibration operation is completed, and a value of the second pull-up impedance calibration code PUZQCD2 at a time when the voltage at the ZQ terminal 201 becomes substantially equal to the reference voltage VREF may be stored in the second storage unit STG1-2. The impedances of the first and second pull-up circuits 210 and 220 may be set based on the second pull-up impedance calibration code PUZQCD2 stored in the second storage unit STG1-2. The pull-up control circuit 260 may further include a control logic circuit which monitors the output of the first comparator 240, and based on the monitored output, determines the value of the second pull-up impedance calibration code PUZQCD2 to be stored in the second storage unit STG1-2.

The fourth impedance calibration operation may be substantially the same as the first impedance calibration operation. However, since the connections of the first input terminal (+) and the second input terminal (−) of the first comparator 240 in the fourth impedance calibration operation are different from those of the first input terminal (+) and the second input terminal (−) of the first comparator 240 in the first impedance calibration operation, the impedances of the first and second pull-up circuits 210 and 220 set by the fourth impedance calibration operation may be different from the impedances of the first and second pull-up circuits 210 and 220 set by the first impedance calibration operation. For example, the offsets of the impedances of the first and second pull-up circuits 210 and 220 caused by the first and second pull-up impedance calibration codes PUZQCD1 and PUZQCD2 may have the same size and opposite polarities. For example, when the resistance of the external resistance RZQ is about 300 ohms, and when the impedances of the first and second pull-up circuits 210 and 220 set by the first impedance calibration operation are about 310 ohms (e.g., when the offset caused by the first pull-up impedance calibration code PUZQCD1 is +10 ohms), the impedances of the first and second pull-up circuits 210 and 220 set by the fourth impedance calibration operation may be about 290 ohms (e.g., the offset caused by the second pull-up impedance calibration code PUZQCD2 may be −10 ohms).

Figure 4D:
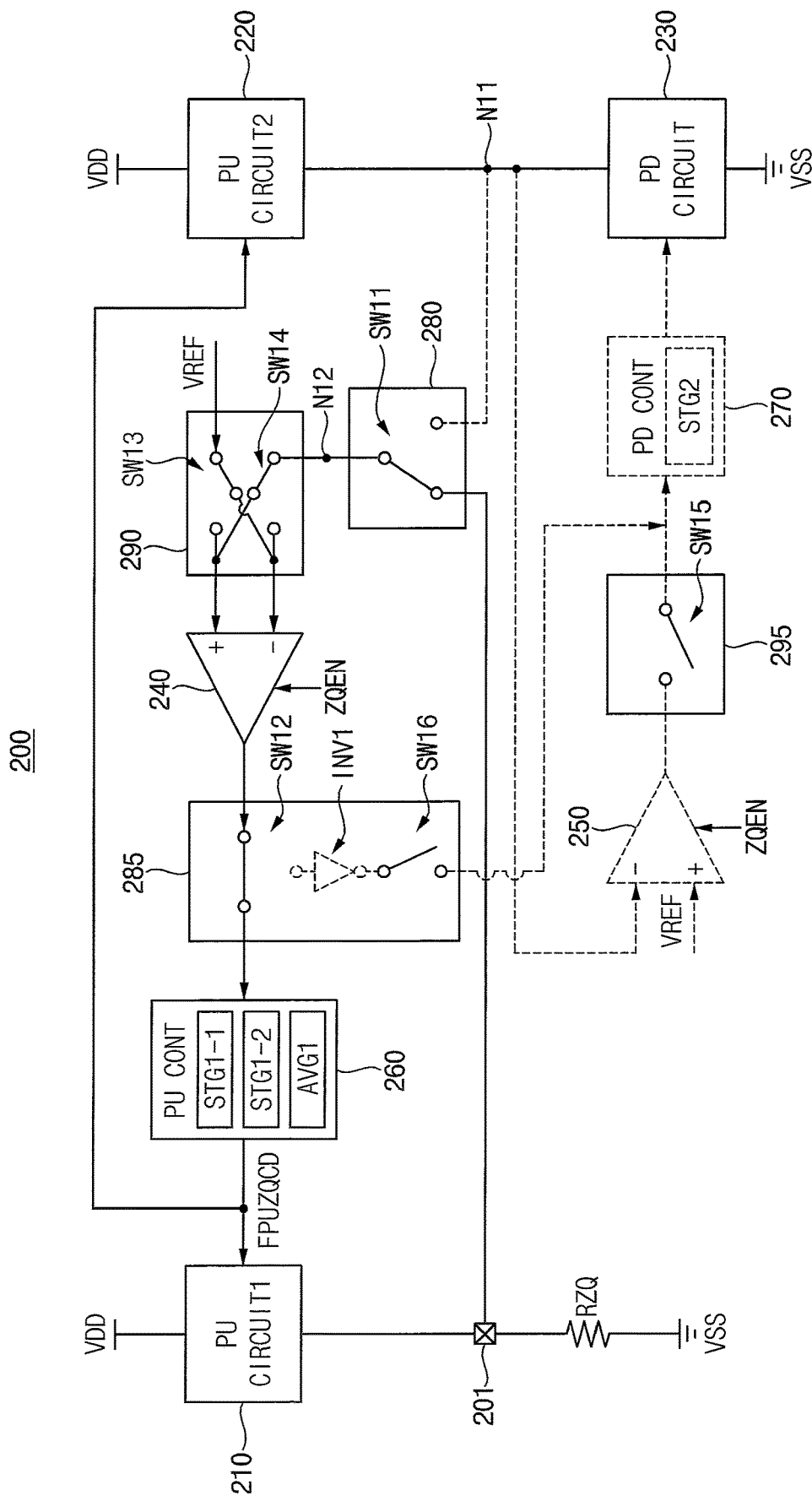

Referring to FIG. 4D, the final pull-up impedance calibration code FPUZQCD may be generated by averaging the first pull-up impedance calibration code PUZQCD1 stored in the first storage unit STG1-1 and the second pull-up impedance calibration code PUZQCD2 stored in the second storage unit STG1-2 using the averaging unit AVG1.

When the first impedance calibration operation is performed, when the fourth impedance calibration operation is performed by swapping the inputs of the first comparator 240, and when the results of the first and fourth impedance calibration operations are averaged, the above-described mismatch and/or offset caused by different input terminals may be canceled, and thus the impedances of the first and second pull-up circuits 210 and 220 may be set to be substantially equal to the resistance of the external resistor RZQ. For example, when the resistance of the external resistance RZQ is about 300 ohms, the impedances of the first and second pull-up circuits 210 and 220 based on the first pull-up impedance calibration code PUZQCD1 may be about 310 ohms, the impedances of the first and second pull-up circuits 210 and 220 based on the second pull-up impedance calibration code PUZQCD2 may be about 290 ohms, and thus the impedances of the first and second pull-up circuits 210 and 220 based on the final pull-up impedance calibration code FPUZQCD may be about 300 ohms.

As described above, when the impedance calibration operation is performed using the impedance calibration circuit according to example embodiments, the comparator mismatch/offset caused by different comparators and the input mismatch/offset caused by different input terminals may be efficiently compensated and canceled.

FIGS. 5, 6A, 6B and 6C are diagrams for describing impedance calibration operations of FIGS. 4A, 4B, 4C and 4D.

Figure 5:
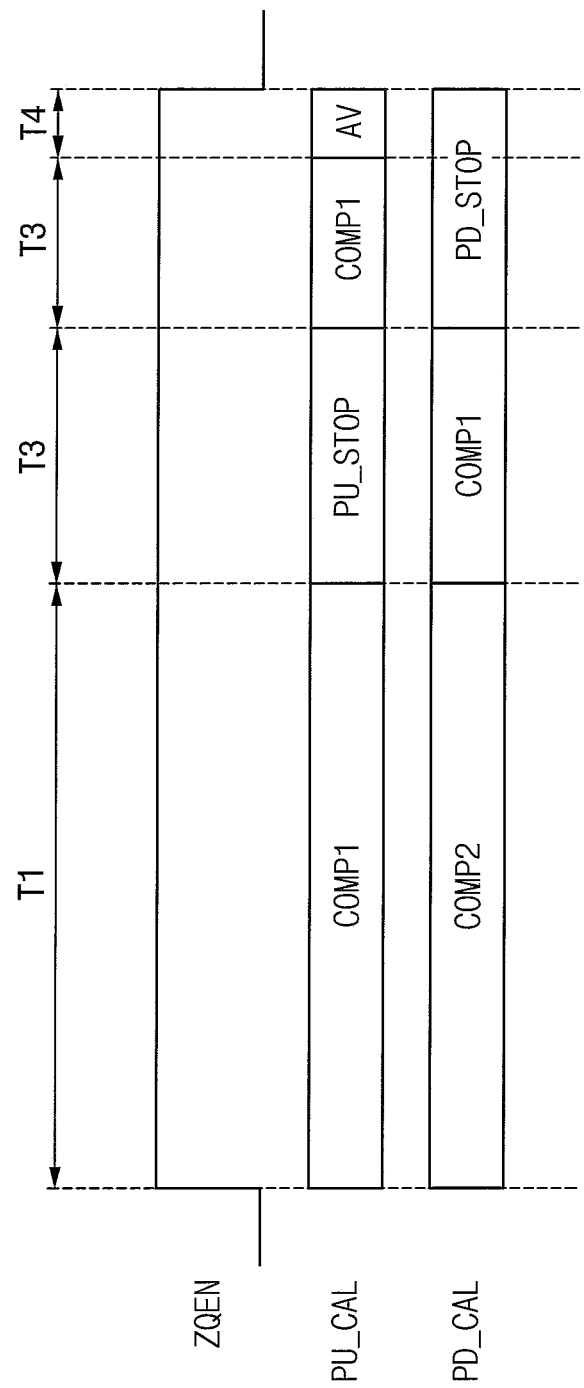
FIGS. 5, 6A, 6B and 6C are diagrams for describing impedance calibration operations of FIGS. 4A, 4B, 4C and 4D.

Referring to FIG. 5, the first, second, third and fourth impedance calibration operations may be performed while the impedance adjustment enable signal ZQEN is activated. In FIG. 5, "PU_CAL" represents an impedance calibration operation using a pull-up loop including the first pull-up circuit 210 and the pull-up control circuit 260, and "PD_CAL" represents an impedance calibration operation using a pull-down loop including a pull-down circuit 230 and a pull-down control circuit 270.

During a time interval T1, as described with reference to FIG. 4A, the pull-up loop may perform a first comparison operation COMP1 and the first impedance calibration operation using the first comparator 240, and the pull-down loop may perform a second comparison operation COMP2 and the second impedance calibration operation using the second comparator 250.

During a time interval T2, as described with reference to FIG. 4B, the pull-down loop may perform a third comparison operation COMP1 and the third impedance calibration operation using the first comparator 240, and the pull-up loop may be disabled and does not perform the impedance calibration operation (e.g., PU_STOP).

During a time interval T3, as described with reference to FIG. 4C, the pull-up loop may perform a fourth comparison operation COMP1 and the fourth impedance calibration operation by using the first comparator 240 and by swapping the inputs of the first comparator 240. During a time interval T4, as described with reference to FIG. 4D, the pull-up loop may generate the final pull-up impedance calibration code FPUZQCD by averaging (e.g., AV) the results of the first and fourth impedance calibration operations. During the time intervals T3 and T4, the pull-down loop may be disabled and may not perform the impedance calibration operation (e.g., PD_STOP).

As described above, when the impedance calibration operation is performed using the impedance calibration circuit according to example embodiments, the locking time may be reduced with a relatively simple structure. The sum of the times intervals T1, T2, T3 and T4 in FIG. 5 may represent the locking time.

Figure 6A:
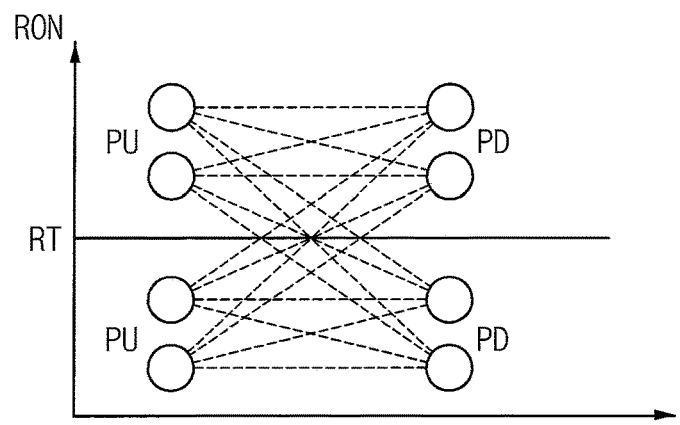
Figure 6B:
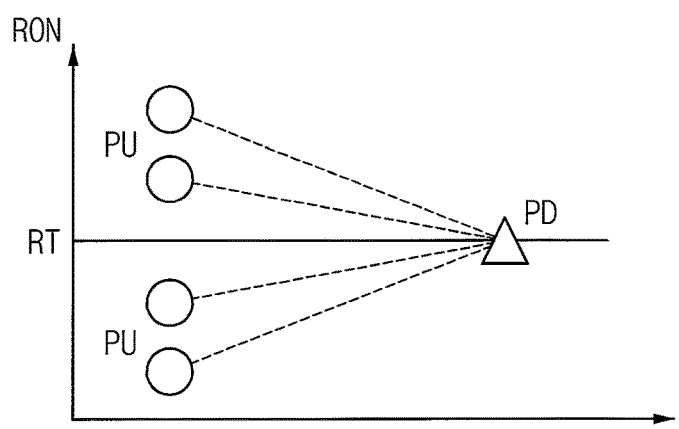
Figure 6C:
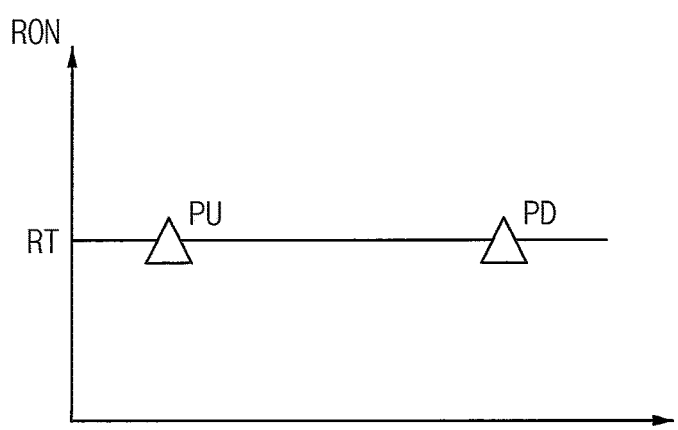

Referring to FIGS. 6A, 6B and 6C, "RON" represents the impedances of the pull-up circuit and the pull-down circuit, and "RT" represents a target impedance, e.g., the resistance of the external resistor RZQ.

As illustrated in FIG. 6A, when only the first and second impedance calibration operations of FIG. 4A are performed, the impedance of the pull-up circuit PU and the impedance of the pull-down circuit PD may be different from the target impedance RT due to the above-described mismatch and/or offset.

As illustrated in FIG. 6B, when the first and second impedance calibration operations of FIG. 4A and the third impedance calibration operation of FIG. 4B are performed, the mismatch and/or offset may be canceled in the pull-down circuit PD, and the impedance of the pull-down circuit PD may be substantially equal to the target impedance RT.

As illustrated in FIG. 6C, when all of the first and second impedance calibration operations of FIG. 4A, the third impedance calibration operation of FIG. 4B and the fourth impedance calibration operation of FIG. 4C are performed, the mismatch and/or offset may be canceled in both the pull-up circuit PU and the pull-down circuit PD, and both the impedance of the pull-up circuit PU and the impedance of the pull-down circuit PD may be substantially equal to the target impedance RT.

Although example embodiments are described based on an example where the third impedance calibration operation and the fourth impedance calibration operation are sequentially performed after the first and second impedance calibration operations are performed, example embodiments are not limited thereto. For example, only the third impedance calibration operation may be performed or only the fourth impedance calibration operation may be performed after the first and second impedance calibration operations are performed.

Figure 7:
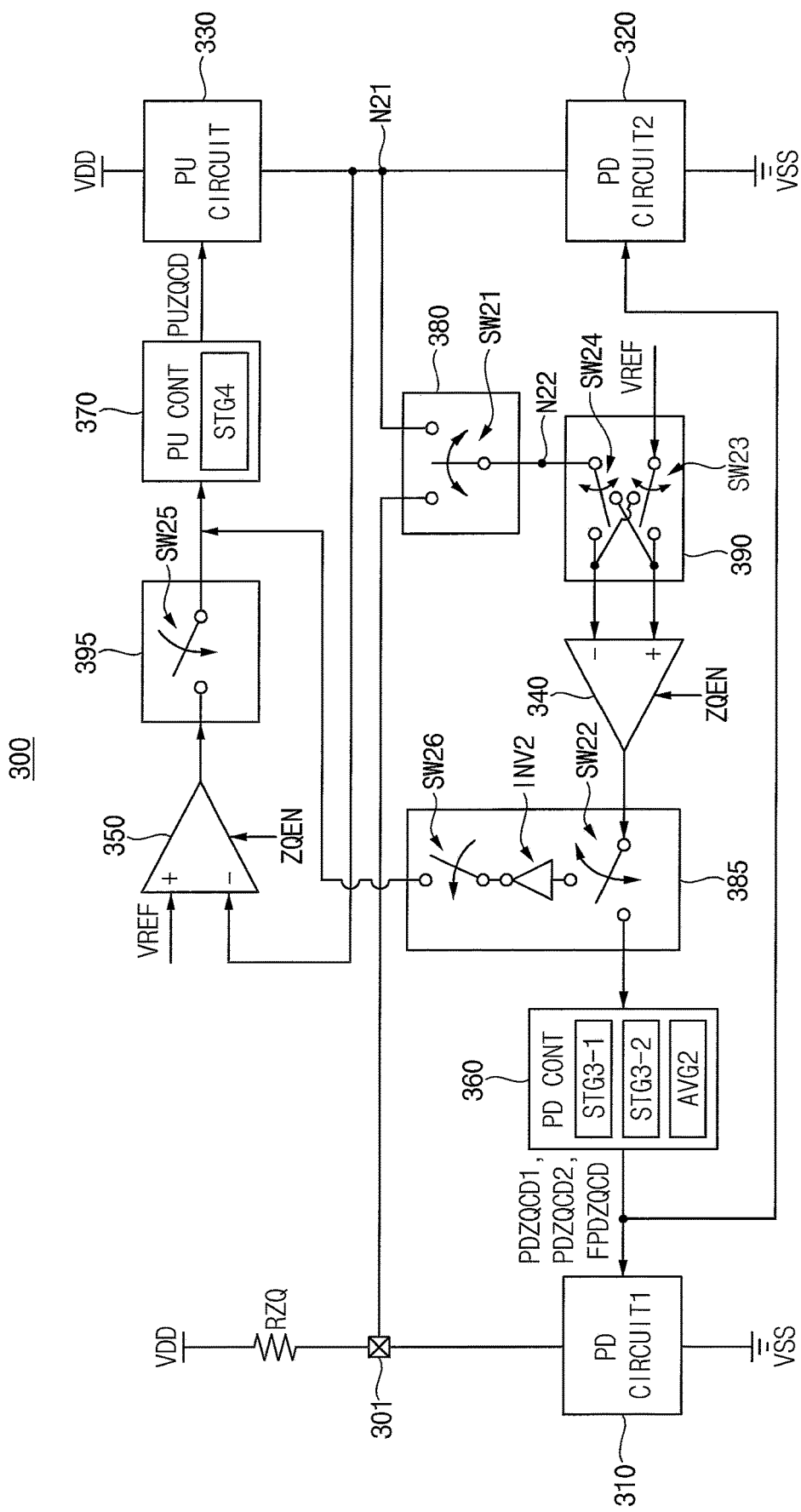
FIG. 7 is a block diagram illustrating another example of an impedance calibration circuit of FIG. 1.

FIG. 7 is a block diagram illustrating another example of an impedance calibration circuit of FIG. 1. The descriptions repeated with FIG. 2 will be omitted.

Referring to FIG. 7, an impedance calibration circuit 300 may include a first pull-down circuit 310, a second pull-down circuit 320, a pull-up circuit 330, a first comparator 340, a second comparator 350, a pull-down control circuit 360, a pull-up control circuit 370, a first switch circuit 380, a second switch circuit 385, a third switch circuit 390 and a fourth switch circuit 395.

FIG. 7 illustrates an example where each of the first and second variable impedance circuits 110 and 120 in FIG. 1 is implemented as a pull-down circuit and the third variable impedance circuit 130 in FIG. 1 is implemented as a pull-up circuit. The first control circuit 160 and the second control circuit 170 in FIG. 1 may correspond to the pull-down control circuit 360 and the pull-up control circuit 370, respectively.

The first pull-down circuit 310 may be connected between a ZQ terminal 301 and a ground voltage VSS, and an external resistor RZQ may be connected between a power supply voltage VDD and the ZQ terminal 301. The second pull-down circuit 320 may be connected between a first node N21 and the ground voltage VSS, and the pull-up circuit 330 may be connected between the power supply voltage VDD and the first node N21.

The first switch circuit 380 may connect one of the ZQ terminal 301 and the first node N21 to a second node N22, and may include a switch SW21. The second switch circuit 385 may provide an output of the first comparator 340 to the pull-down control circuit 360 or to the pull-up control circuit 370, and may include switches SW22 and SW26 and an inverter INV2. The third switch circuit 390 may connect a reference voltage VREF and the second node N22 to a first input terminal (+) and a second input terminal (−) of the first comparator 340, and may include switches SW23 and SW24. The fourth switch circuit 395 may selectively provide an output of the second comparator 350 to the pull-up control circuit 370, and may include a switch SW25.

The first comparator 340 may compare a voltage at the ZQ terminal 301 with the reference voltage VREF or may compare a voltage at the first node N21 with the reference voltage VREF. The pull-down control circuit 360 may perform an impedance calibration operation on the first pull-down circuit 310 based on the output of the first comparator 340, may generate a first pull-down impedance calibration code PDZQCD1, a second pull-down impedance calibration code PDZQCD2 and a final pull-down impedance calibration code FPDZQCD, and may include a first storage unit STG3-1, a second storage unit STG3-2 and an averaging unit AVG2.

The second comparator 350 may compare the voltage at the first node N21 with the reference voltage VREF. The pull-up control circuit 370 may perform an impedance calibration operation on the pull-up circuit 330 based on the output of the second comparator 350 or based on the output of the first comparator 340, may generate a pull-up impedance calibration code PUZQCD, and may include a storage unit STG4.

An operation of the impedance calibration circuit 300 may be performed similarly to that described with reference to FIGS. 4A, 4B, 4C, 4D, 5, 6A, 6B and 6C. For example, similar to that described with reference to FIG. 4A, a first impedance calibration operation may be performed on the first pull-down circuit 310 and the second pull-down circuit 320 and a second impedance calibration operation may be performed on the pull-up circuit 330. After that, similar to that described with reference to FIG. 4B, a third impedance calibration operation may be additionally performed on the pull-up circuit 330. After that, similar to that described with reference to FIGS. 4C and 4D, a fourth impedance calibration operation may be additionally performed on the first pull-down circuit 310 and the second pull-down circuit 320.

Figure 8:
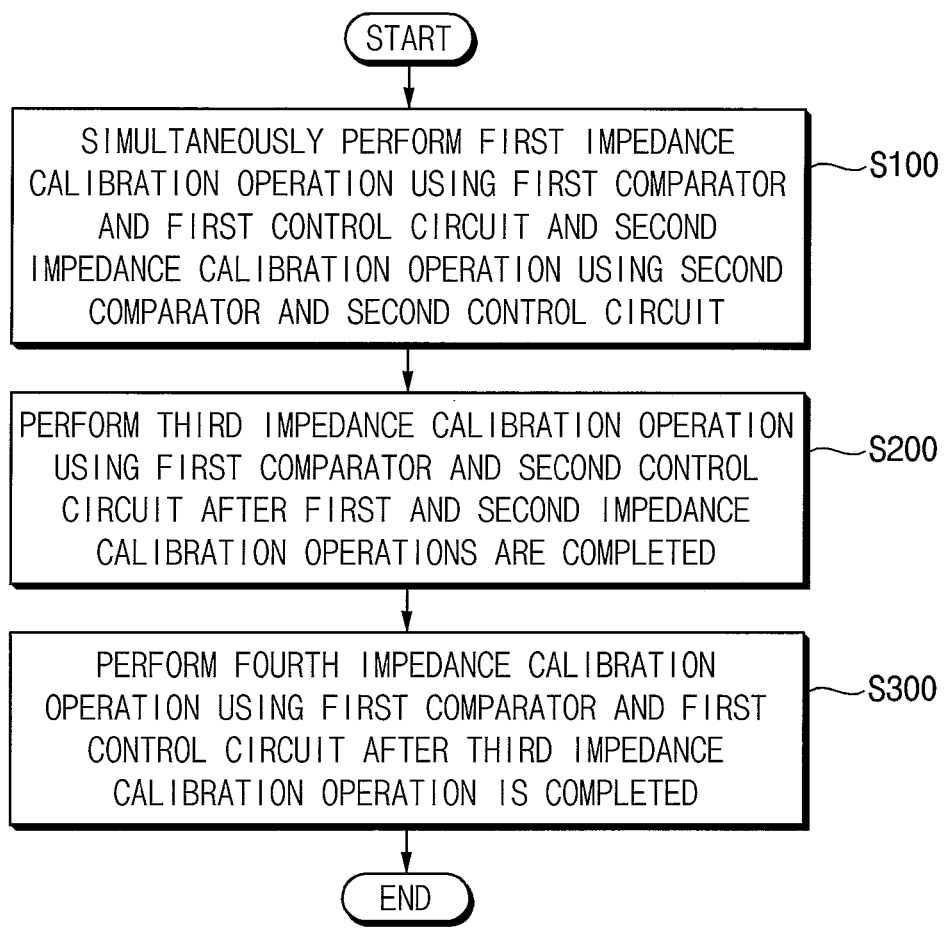
FIG. 8 is a flowchart illustrating a method of calibrating impedance according to example embodiments.

FIG. 8 is a flowchart illustrating a method of calibrating impedance according to example embodiments.

Referring to FIGS. 1 and 8, in a method of calibrating impedance according to example embodiments, the first impedance calibration operation and the second impedance calibration operation are substantially simultaneously performed (step S100). The first impedance calibration operation is performed on the first variable impedance circuit 110 and the second variable impedance circuit 120 based on the voltage at the ZQ terminal 101 and the reference voltage VREF, and using the first comparator 140 and the first control circuit 160. The second impedance calibration operation is performed on the third variable impedance circuit 130 based on the voltage at the first node N1 and the reference voltage VREF, and using the second comparator 150 and the second control circuit 170. For example, step S100 may be performed as illustrated in FIG. 4A.

After the first impedance calibration operation and the second impedance calibration operation are completed, the third impedance calibration operation is performed on the third variable impedance circuit 130 based on the voltage at the first node N1 and the reference voltage VREF, and using the first comparator 140 and the second control circuit 170 (step S200). For example, step S200 may be performed as illustrated in FIG. 4B.

After the third impedance calibration operation is completed, a fourth impedance calibration operation is performed on the first variable impedance circuit 110 and the second variable impedance circuit 120 based on the voltage at the ZQ terminal 101 and the reference voltage VREF, and using the first comparator 140 and the first control circuit 160 (step S300). For example, step S300 may be performed as illustrated in FIGS. 4C and 4D.

Figure 9:
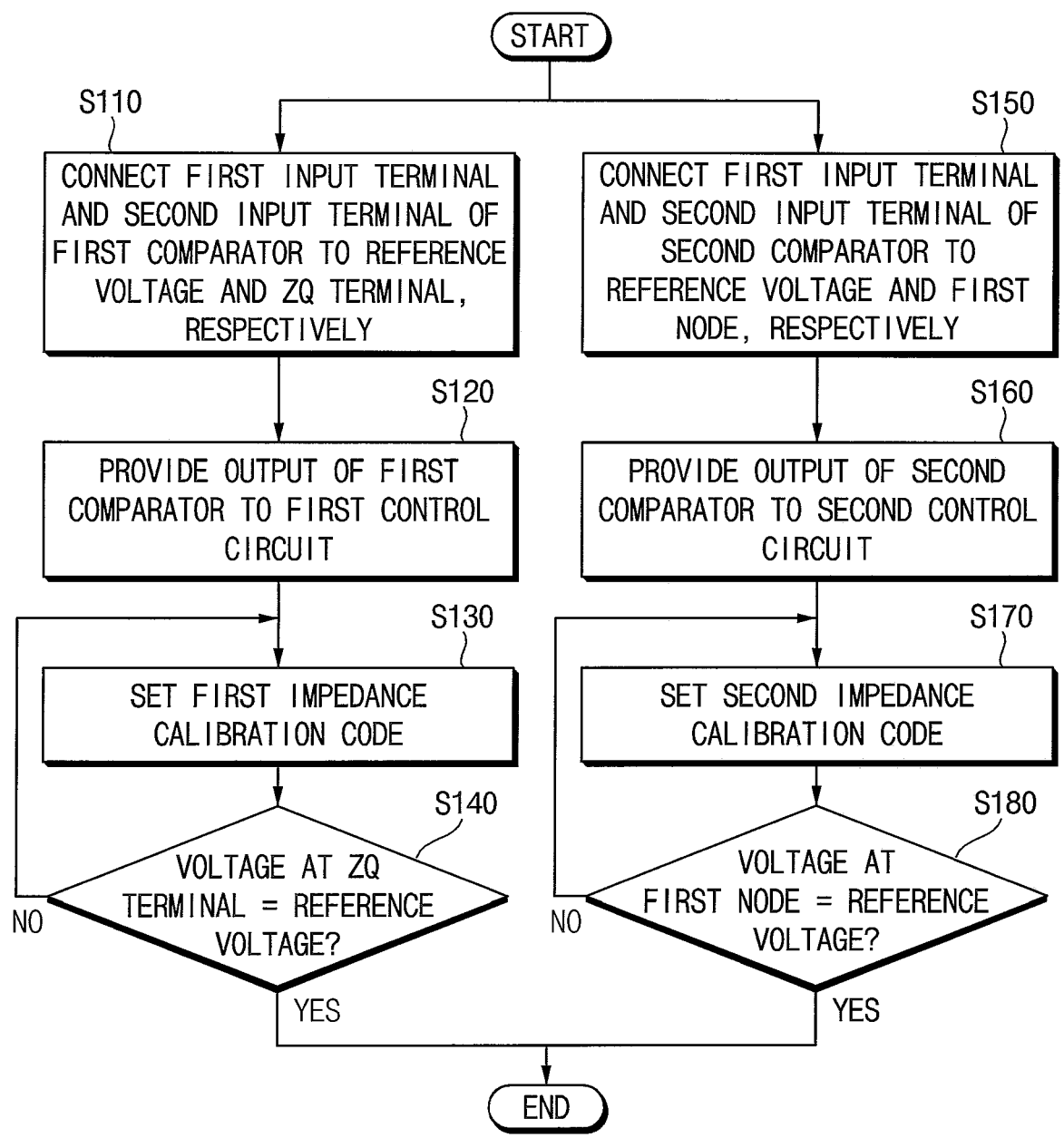
FIG. 9 is a flowchart illustrating an example of simultaneously performing first and second impedance calibration operations in FIG. 8.

FIG. 9 is a flowchart illustrating an example of simultaneously performing first and second impedance calibration operations in FIG. 8.

Referring to FIGS. 1, 8 and 9, when simultaneously performing the first and second impedance calibration operations (step S100), the first impedance calibration operation may be performed as in steps S110, S120, S130 and S140, and the second impedance calibration operation may be performed as in steps S150, S160, S170 and S180.

For example, when performing the first impedance calibration operation, the first input terminal and the second input terminal of the first comparator 140 may be connected to the reference voltage VREF and the ZQ terminal 101, respectively (step S110). The output of the first comparator 140 may be provided to the first control circuit 160 (step S120). The first impedance calibration code ZQCD1 may be set (step S130).

When the voltage at the ZQ terminal 101 and the reference voltage VREF are different from each other (step S140: NO), the first impedance calibration code ZQCD1 may be set again (e.g., changed) by returning to step S130, and then step S140 may be performed again. When the voltage at the ZQ terminal 101 and the reference voltage VREF are substantially equal to each other (step S140: YES), the first impedance calibration operation may be completed. For example, the impedance of the first variable impedance circuit 110 may be adjusted by changing the first impedance calibration code ZQCD1 until the voltage at the ZQ terminal 101 becomes substantially equal to the reference voltage VREF.

Similarly, when performing the second impedance calibration operation, the first input terminal and the second input terminal of the second comparator 150 may be connected to the reference voltage VREF and the first node N1, respectively (step S150). The output of the second comparator 150 may be provided to the second control circuit 170 (step S160). The second impedance calibration code ZQCD2 may be set (step S170).

When the voltage at the first node N1 and the reference voltage VREF are different from each other (step S180: NO), the second impedance calibration code ZQCD2 may be set again (e.g., changed) by returning to step S170, and then step S180 may be performed again. When the voltage at the first node N1 and the reference voltage VREF are substantially equal to each other (step S180: YES), the second impedance calibration operation may be completed. For example, the impedance of the third variable impedance circuit 130 may be adjusted by changing the second impedance calibration code ZQCD2 until the voltage at the first node N1 becomes substantially equal to the reference voltage VREF.

Figure 10:
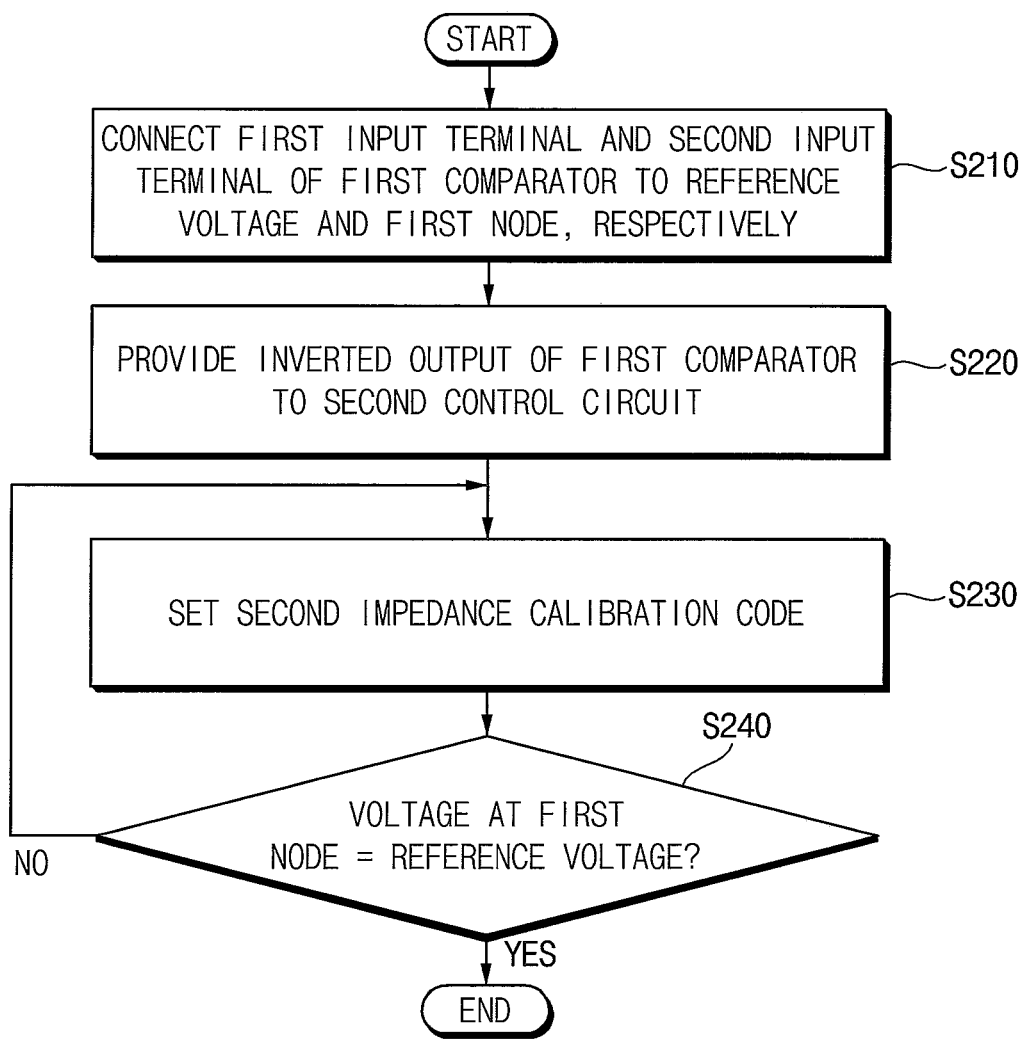
FIG. 10 is a flowchart illustrating an example of performing a third impedance calibration operation in FIG. 8.

FIG. 10 is a flowchart illustrating an example of performing a third impedance calibration operation in FIG. 8.

Referring to FIGS. 1, 8 and 10, when performing the third impedance calibration operation (step S200), the first input terminal and the second input terminal of the first comparator 140 may be connected to the reference voltage VREF and the first node N1, respectively (step S210). The output of the first comparator 140 may be inverted and the inverted output of the first comparator 140 may be provided to the second control circuit 170 (step S220). The second impedance calibration code ZQCD2 may be set (step S230).

When the voltage at the first node N1 and the reference voltage VREF are different from each other (step S240: NO), the second impedance calibration code ZQCD2 may be set again (e.g., changed) by returning to step S230, and then step S240 may be performed again. When the voltage at the first node N1 and the reference voltage VREF are substantially equal to each other (step S240: YES), the third impedance calibration operation may be completed. For example, the impedance of the third variable impedance circuit 130 may be adjusted by changing the second impedance calibration code ZQCD2 until the voltage at the first node N1 becomes substantially equal to the reference voltage VREF.

Figure 11:
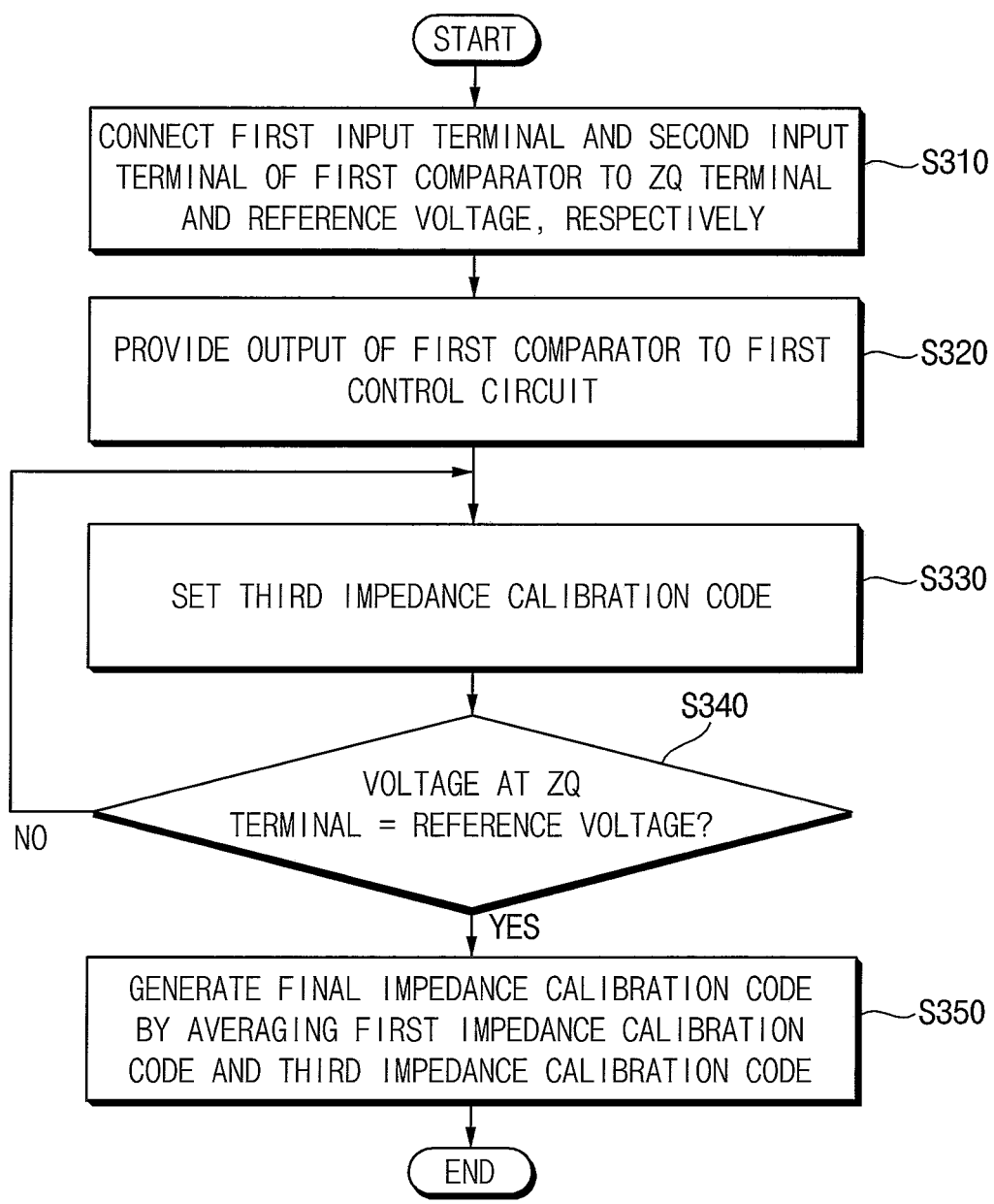
FIG. 11 is a flowchart illustrating an example of performing a fourth impedance calibration operation in FIG. 8.

FIG. 11 is a flowchart illustrating an example of performing a fourth impedance calibration operation in FIG. 8.

Referring to FIGS. 1, 8 and 11, when performing the fourth impedance calibration operation (step S300), the first input terminal and the second input terminal of the first comparator 140 may be connected to the ZQ terminal 101 and the reference voltage VREF, respectively (step S310). The output of the first comparator 140 may be provided to the first control circuit 160 (step S320). The third impedance calibration code ZQCD3 may be set (step S330).

When the voltage at the ZQ terminal 101 and the reference voltage VREF are different from each other (step S340: NO), the third impedance calibration code ZQCD3 may be set again (e.g., changed) by returning to step S330, and then step S340 may be performed again. When the voltage at the ZQ terminal 101 and the reference voltage VREF are substantially equal to each other (step S340: YES), the fourth impedance calibration operation may be completed. For example, the inputs of the first comparator 140 may be swapped, and the impedance of the first variable impedance circuit 110 may be adjusted by changing the third impedance calibration code ZQCD3 until the voltage at the ZQ terminal 101 becomes substantially equal to the reference voltage VREF.

After that, the final impedance calibration code FZQCD may be generated by averaging the first impedance calibration code ZQCD1 and the third impedance calibration code ZQCD3 (step S350). The impedance of the first variable impedance circuit 110 may be finally determined based on the final impedance calibration code FZQCD.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Hereinafter, configurations of a nonvolatile memory device including the impedance calibration circuit according to example embodiments and a storage device including the nonvolatile memory device will be described.

Figure 12:
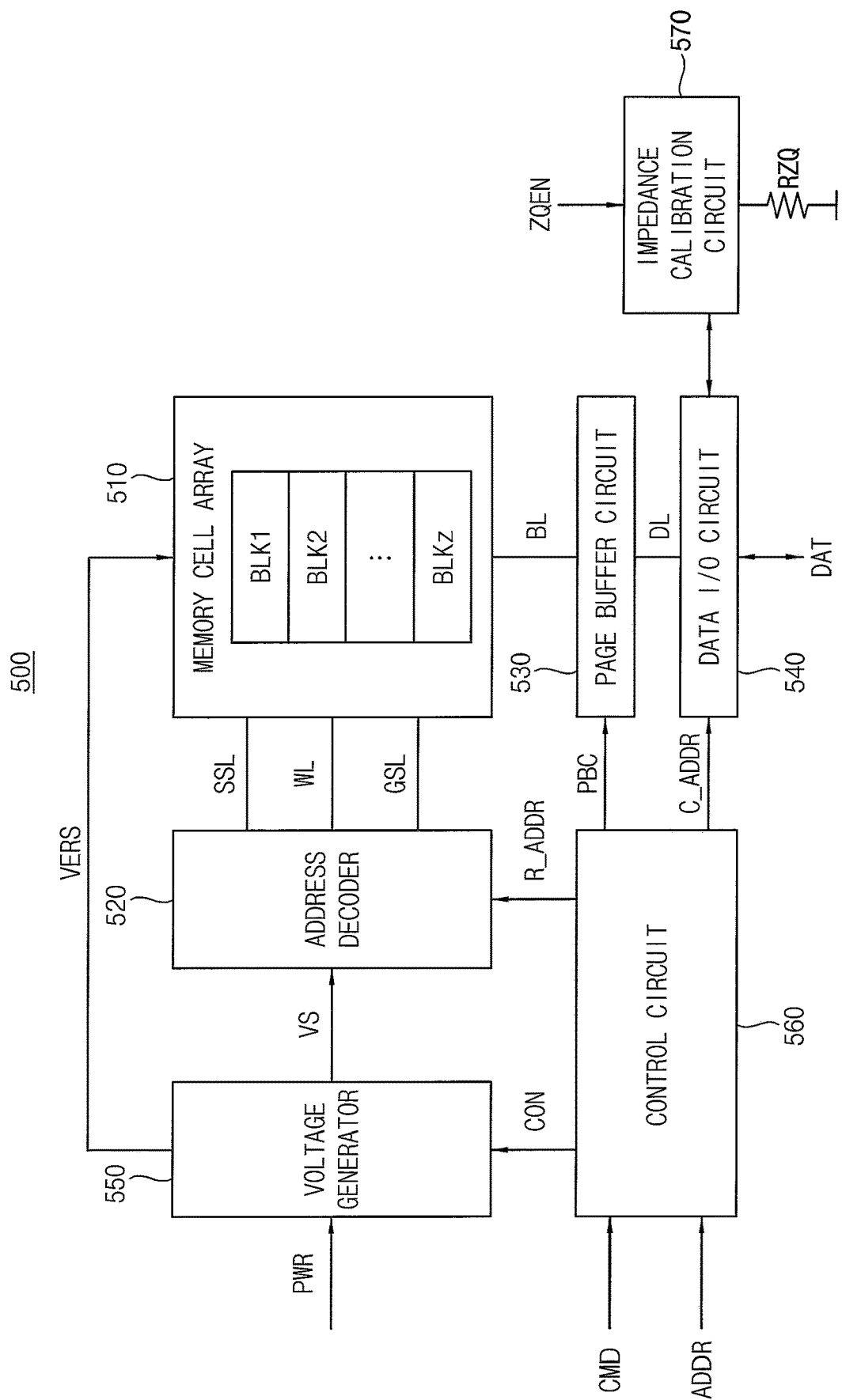
FIG. 12 is a block diagram illustrating a nonvolatile memory device according to example embodiments.

FIG. 12 is a block diagram illustrating a nonvolatile memory device according to example embodiments.

Referring to FIG. 12, a nonvolatile memory device 500 includes a memory cell array 510, an address decoder 520, a page buffer circuit 530, a data input/output (I/O) circuit 540, a voltage generator 550, a control circuit 560 and an impedance calibration circuit 570.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages.

In some example embodiments, as will be described with reference to FIGS. 13 and 14, the memory cell array 510 may be a three-dimensional memory cell array, which is formed on a substrate in a three-dimensional structure (or a vertical structure). For example, the memory cell array 510 may include a plurality of cell strings (e.g., a plurality of vertical NAND strings) that are vertically oriented such that at least one memory cell is located over another memory cell.

The control circuit 560 receives a command CMD and an address ADDR from an outside (e.g., from a memory controller), and control erasure, programming and read operations of the nonvolatile memory device 500 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 560 may generate control signals CON, which are used for controlling the voltage generator 550, and may generate control signal PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540. In an embodiment, the control circuit 560 may generate switch control signals for controlling the impedance calibration circuit 570. As described above with reference to FIG. 1 to FIGS. 4A to 4D, the switch control signals may include the first to fourth impedance control signals associated with the first to fourth impedance calibration operations, respectively.

The address decoder 520 may be connected to the memory cell array 510 via the plurality of string selection lines SSL, the plurality of wordlines WL and the plurality of ground selection lines GSL.

For example, in the data erase/write/read operations, the address decoder 520 may determine at least one of the plurality of wordlines WL as a selected wordline, and may determine the rest or remainder of the plurality of wordlines WL other than the selected wordline as unselected wordlines, based on the row address R_ADDR.

In the data erase/write/read operations, the address decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

In the data erase/write/read operations, the address decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are required for an operation of the nonvolatile memory device 500 based on a power PWR and the control signals CON. The voltages VS may be applied to the plurality of string selection lines SSL, the plurality of wordlines WL and the plurality of ground selection lines GSL via the address decoder 520. The voltage generator 550 may further generate an erase voltage VERS that is required for the data erase operation based on the power PWR and the control signals CON. The erase voltage VERS may be applied to the memory cell array 510 directly or via the bitline BL.

For example, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply the erase verification voltage VEVFY simultaneously to all wordlines of the memory block or sequentially to the wordlines one by one via the address decoder 520.

For example, during the program operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

During the normal read operation, the voltage generator 550 may apply a read voltage to the selected wordline and may apply a read pass voltage to the unselected wordlines via the address decoder 520. During the data recover read operation, the voltage generator 550 may apply the read voltage to a wordline adjacent to the selected wordline and may apply a recover read voltage to the selected wordline via the address decoder 520.

The page buffer circuit 530 may be connected to the memory cell array 510 via the plurality of bitlines BL. The page buffer circuit 530 may include a plurality of page buffers. In some example embodiments, each page buffer may be connected to one bitline. In some example embodiments, each page buffer may be connected to two or more bitlines.

The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the nonvolatile memory device 500.

The data I/O circuit 540 may be connected to the page buffer circuit 530 via data lines DL. The data I/O circuit 540 may provide the data DAT from the outside of the nonvolatile memory device 500 to the memory cell array 510 via the page buffer circuit 530 or may provide the data DAT from the memory cell array 510 to the outside of the nonvolatile memory device 500, based on the column address C_ADDR.

The impedance calibration circuit 570 may be connected to the data I/O circuit 540, may be connected to an external resistor RZQ, and may perform an impedance calibration operation on a data I/O terminal (or pin) included in the data I/O circuit 540 based on an impedance calibration enable signal ZQEN. For example, the control circuit 560 may generate the impedance calibration enable signal ZQEN based on an impedance calibration command. In some example embodiments, the impedance calibration circuit 570 may be included in the data I/O circuit 540.

The impedance calibration circuit 570 may be the impedance calibration circuit according to example embodiments described with reference to FIGS. 1 through 7, and may perform the method of calibrating impedance according to example embodiments described with reference to FIGS. 8 through 11.

Figure 13:
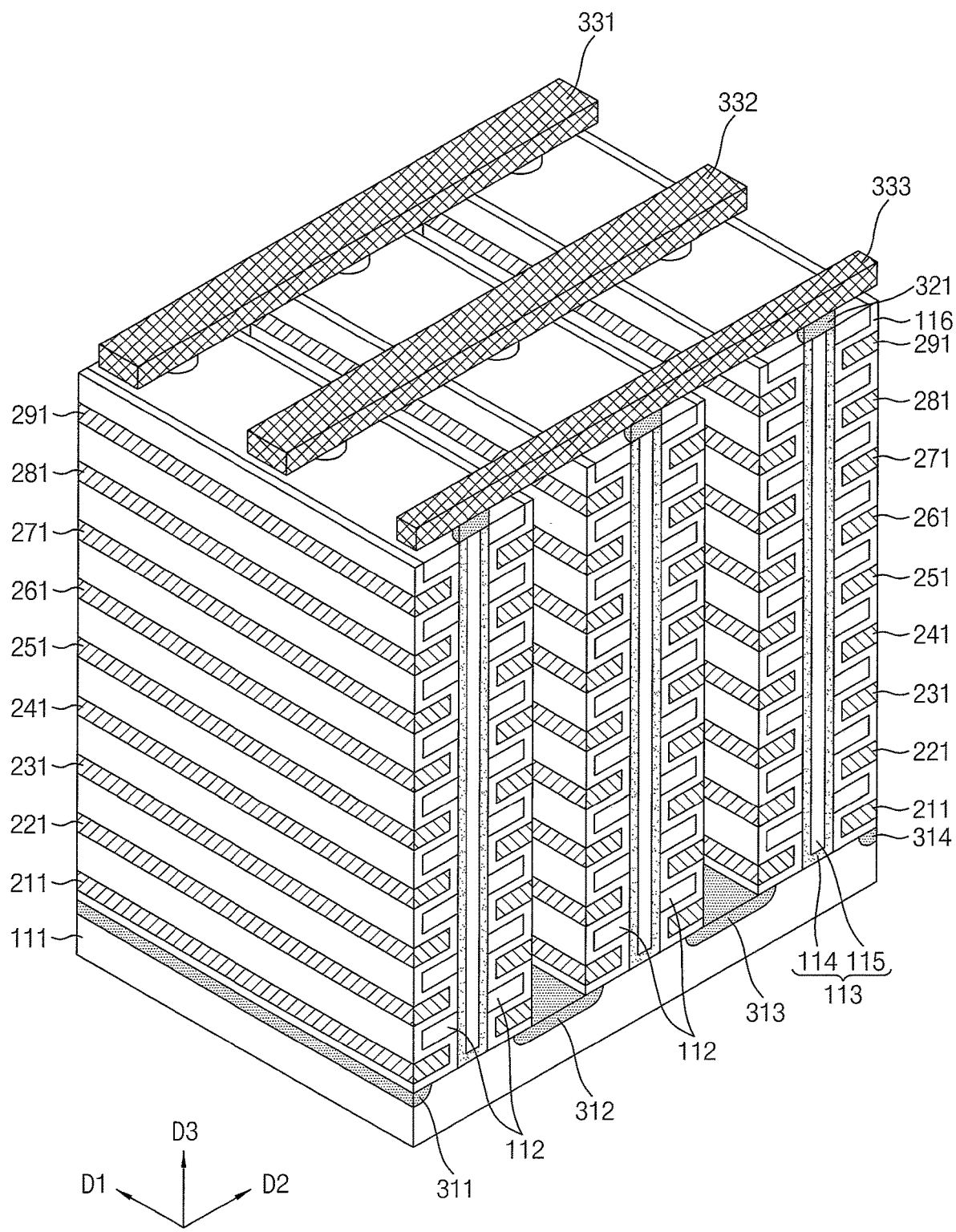
FIG. 13 is a perspective view of an example of a memory block included in a memory cell array of a nonvolatile memory device of FIG. 12.

FIG. 13 is a perspective view of an example of a memory block included in a memory cell array of a nonvolatile memory device of FIG. 12.

Referring to FIG. 13, a memory block BLKi includes a plurality of cell strings (e.g., a plurality of vertical NAND strings) which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 has a p-type well (or a p-type pocket well). However, the conductive type of the substrate 111 is not limited to p-type.

A plurality of doping regions 311, 312, 313 and 314 arranged along the second direction D2 are provided in/on the substrate 111. These plurality of doping regions 311 to 314 may have a second type of charge carrier impurity (e.g., a second conductivity type) different from the first type of the substrate 111. In one embodiment of the invention, the first to fourth doping regions 311 to 314 may have n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include or may be formed of an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include or may be formed of a silicon material having a first conductivity type. For example, the channel layer 114 of each pillar 113 may include or may be formed of a silicon material having the same conductivity type as the substrate 111. In one embodiment of the invention, the channel layer 114 of each pillar 113 includes or is formed of p-type silicon. However, the channel layer 114 of each pillar 113 is not limited to the p-type silicon.

An internal material 115 of each pillar 113 includes an insulation material. For example, the internal material 115 of each pillar 113 may include or may be formed of an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). For example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the invention the first conductive materials 211 to 291 may include or may be formed of a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 321 are provided on the plurality of pillars 113, respectively. The drain regions 321 may include or may be formed of silicon materials doped with a second type of charge carrier impurity. For example, the drain regions 321 may include or may be formed of silicon materials doped with an n-type dopant. In one embodiment of the invention, the drain regions 321 include or is formed of n-type silicon materials. However, the drain regions 321 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 321 in a corresponding region. The drain regions 321 and the second conductive material 333 extending along the second direction D2 may be connected through each contact plug. Each contact plug may be, for example, a conductive plug formed of a conductive material such as a metal. The second conductive materials 331 to 333 may include or may be formed of metal materials. The second conductive materials 331 to 333 may include or may be formed of conductive materials such as a polysilicon.

In the example of FIG. 13, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 14:
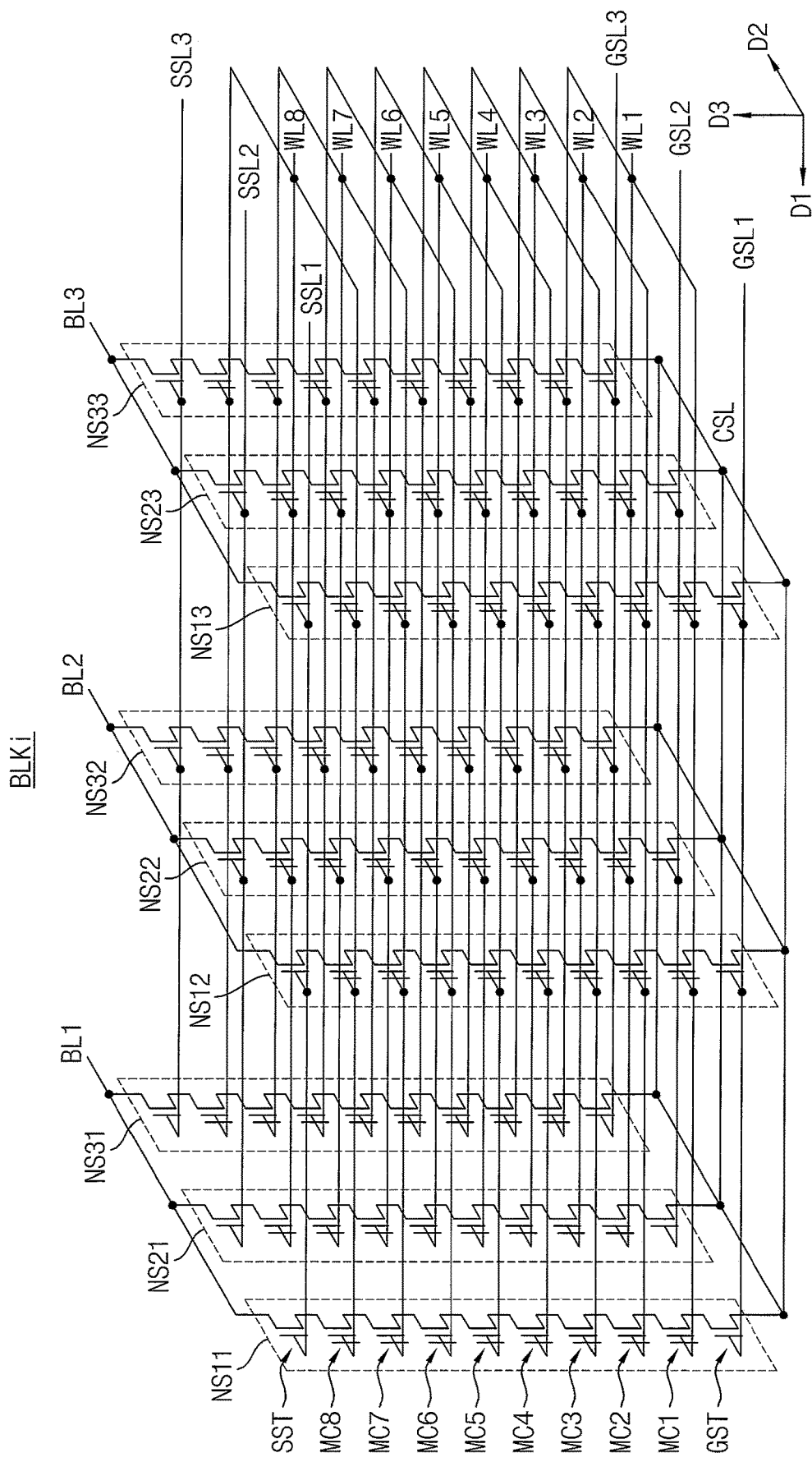
FIG. 14 is a circuit diagram illustrating an equivalent circuit of a memory block described with reference to FIG. 13.

FIG. 14 is a circuit diagram illustrating an equivalent circuit of a memory block described with reference to FIG. 13.

A memory block BLKi of FIG. 14 may be formed on a substrate in a three-dimensional structure (or a vertical structure). For example, a plurality of NAND strings included in the memory block BLKi may be formed in a direction perpendicular to the substrate.

Referring to FIG. 14, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 13, and the common source line CSL may be formed by interconnecting the first to fourth doping regions 311 to 314 in FIG. 13.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 14, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 14, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, example embodiments are not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 15:
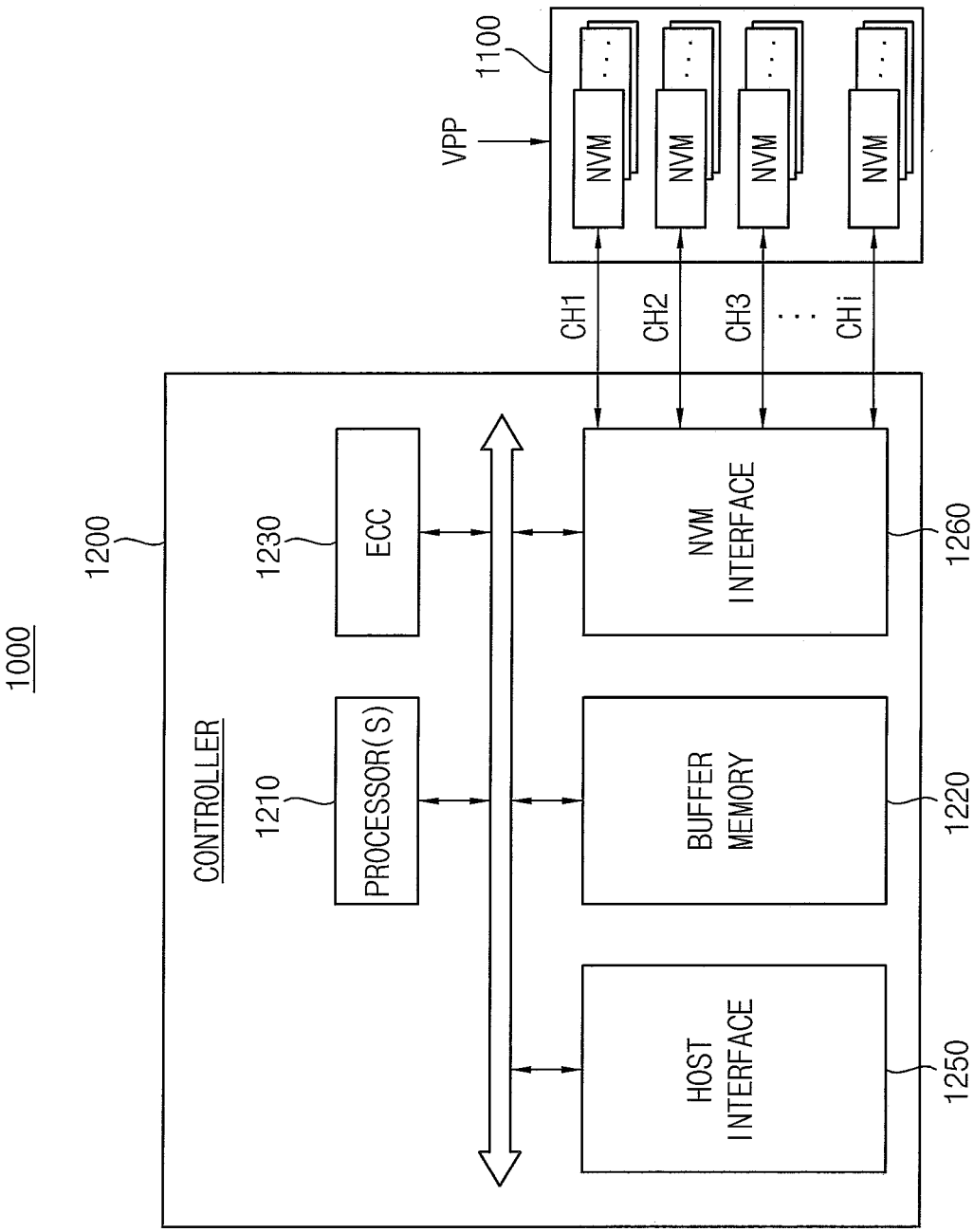
FIG. 15 is a block diagram illustrating a storage device that includes a nonvolatile memory device according to example embodiments.

FIG. 15 is a block diagram illustrating a storage device that includes a nonvolatile memory device according to example embodiments.

Referring to FIG. 15, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3 . . . CHi. The controller 1200 may include one or more processors 1210, a buffer memory 1220, an error correction code (ECC) circuit 1230, a host interface 1250 and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device according to example embodiments, and may be optionally supplied with an external high voltage VPP.

Figure 16:
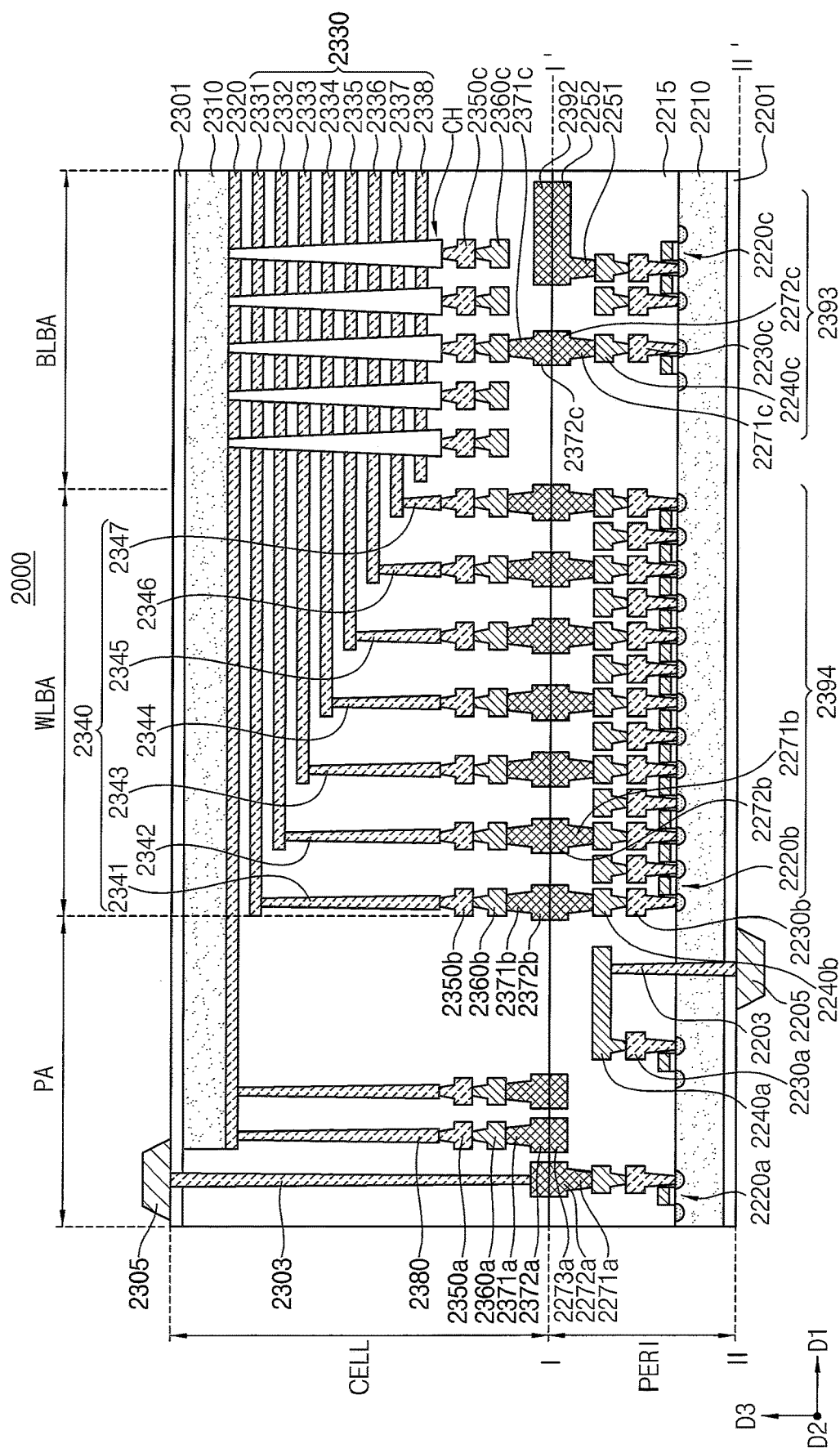
FIG. 16 is a cross-sectional view of a nonvolatile memory device according to example embodiments.

FIG. 16 is a cross-sectional view of a nonvolatile memory device according to example embodiments.

Referring to FIG. 16, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include or may be formed of copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 16, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include or may be formed of an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second direction D2 (e.g., a Y-axis direction), parallel to the upper surface of the second substrate 2310.

In an example embodiment illustrated in FIG. 16, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. The bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating layer 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to embodiments, the second substrate 2310 and the common source line 2320 are not disposed in an area in which the second input/output contact plug 2303 is disposed. The second input/output pad 2305 may not overlap the wordlines 2330 in the third direction D3 (e.g., the Z-axis direction). The second input/output contact plug 2303 may be separated from the second substrate 2310 in the direction, parallel to the upper surface of the second substrate 2310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 2000 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The memory device 2000 may include the impedance calibration circuit according to example embodiments, and may be implemented to perform the method of calibrating impedance according to example embodiments.

The inventive concept may be applied to various electronic devices and systems that include the memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An impedance calibration circuit included in a memory device comprising:
a first variable impedance circuit connected to a ZQ terminal;
a second variable impedance circuit and a third variable impedance circuit connected to a first node;
a first comparator configured to compare one of a voltage at the ZQ terminal and a voltage at the first node with a reference voltage;
a second comparator configured to compare the voltage at the first node with the reference voltage;
a first control circuit configured to perform a first impedance calibration operation on the first variable impedance circuit based on an output signal from an output of the first comparator;
a second control circuit configured to perform a second impedance calibration operation on the third variable impedance circuit based on an output signal from an output of the second comparator;
a first switch circuit configured to connect an input of the first comparator to one of the ZQ terminal and the first node;
a second switch circuit configured to connect the output of the first comparator to one of the first control circuit and the second control circuit; and
a third switch circuit configured to connect an output of the first switch circuit to one of a first input terminal and a second input terminal of the first comparator and connect the reference voltage to the other.

2. The impedance calibration circuit of claim 1, wherein:
the first comparator and the first control circuit are configured to perform the first impedance calibration operation on the first variable impedance circuit, and
the second comparator and the second control circuit are configured to perform the second impedance calibration operation on the third variable impedance circuit.

3. The impedance calibration circuit of claim 2, wherein the first impedance calibration operation and the second impedance calibration operation are simultaneously performed.

4. The impedance calibration circuit of claim 2,
wherein, the first switch circuit, the second switch circuit, and the third switch circuit are configured to operate such that when the first impedance calibration operation is performed, a second node corresponding to the input of the first comparator is connected to the ZQ terminal using the first switch circuit, the output of the first comparator is connected to the first control circuit using the second switch circuit, and the first input terminal of the first comparator is connected to the reference voltage and the second input terminal of the first comparator is connected to the second node using the third switch circuit.

5. The impedance calibration circuit of claim 2,
wherein the first comparator and the second control circuit are configured to perform, after the first impedance calibration operation and the second impedance calibration operation are completed, a third impedance calibration operation on the third variable impedance circuit.

6. The impedance calibration circuit of claim 5,
wherein the first switch circuit, the second switch circuit, and the third switch circuit are configured to operate such that, when the third impedance calibration operation is performed, a second node corresponding to the input of the first comparator is connected to the first node using the first switch circuit, the output of the first comparator is connected to the second control circuit using the second switch circuit, and the first input terminal of the first comparator is connected to the reference voltage and the second input terminal of the first comparator is connected to the second node using the third switch circuit.

7. The impedance calibration circuit of claim 6,
wherein the second switch circuit includes:
an inverter configured to:
invert the output of the first comparator; and
provide an inverted output of the first comparator to the second control circuit.

8. The impedance calibration circuit of claim 6, further comprising:
a fourth switch circuit configured to:
during a time when the first impedance calibration operation is performed, connect the output of the second comparator to the second control circuit; and
during a time when the third impedance calibration operation is performed, disconnect the connection between the output of the second comparator and the second control circuit from each other.

9. The impedance calibration circuit of claim 5,
wherein the first comparator and the first control circuit are configured to perform, after the third impedance calibration operation is completed, a fourth impedance calibration operation on the first variable impedance circuit.

10. The impedance calibration circuit of claim 9,
wherein the first switch circuit, the second switch circuit, and the third switch circuit are configured to operate such that, when the fourth impedance calibration operation is performed, a second node corresponding to the input of the first comparator is connected to the ZQ terminal using the first switch circuit, the output of the first comparator is connected to the first control circuit using the second switch circuit, and the first input terminal of the first comparator is connected to the second node and the second input terminal of the first comparator is connected to the reference voltage using the third switch circuit.

11. The impedance calibration circuit of claim 10,
wherein the first control circuit includes:
a first storage circuit configured to store a first impedance calibration code corresponding to a result of the first impedance calibration operation;
a second storage circuit configured to store a second impedance calibration code corresponding to a result of the fourth impedance calibration operation; and
an averaging circuit configured to generate a final impedance calibration code by averaging the first impedance calibration code and the second impedance calibration code.

12. The impedance calibration circuit of claim 9, wherein:
during a time when an impedance calibration enable signal is activated, the first impedance calibration operation and the second impedance calibration operation are simultaneously performed, and
during a time when the impedance calibration enable signal is activated, the third impedance calibration operation and the fourth impedance calibration operation are sequentially performed after the first impedance calibration operation and the second impedance calibration operation are completed.

13. The impedance calibration circuit of claim 1, wherein:
the first variable impedance circuit is a first pull-up circuit connected between a power supply voltage and the ZQ terminal,
the second variable impedance circuit is a second pull-up circuit connected between the power supply voltage and the first node, and
the third variable impedance circuit is a pull-down circuit connected between the first node and a ground voltage.

14. The impedance calibration circuit of claim 13,
wherein the first pull-up circuit includes:
a plurality of transistors connected in parallel between the power supply voltage and the ZQ terminal.

15. The impedance calibration circuit of claim 1, wherein:
the first variable impedance circuit is a first pull-down circuit connected between the ZQ terminal and a ground voltage,
the second variable impedance circuit is a second pull-down circuit connected between the first node and the ground voltage,
the third variable impedance circuit is a pull-up circuit connected between a power supply voltage and the first node.

16. A method of calibrating impedance using an impedance calibration circuit that is included in a memory device and includes a first variable impedance circuit, a second variable impedance circuit, a third variable impedance circuit, a first comparator, a second comparator, a first control circuit and a second control circuit, the method comprising:
simultaneously performing a first impedance calibration operation and a second impedance calibration operation, the first impedance calibration operation being performed by the first comparator and the first control circuit on the first variable impedance circuit based on a voltage at a ZQ terminal and a reference voltage, the second impedance calibration operation being performed by the second comparator and the second control circuit on the third variable impedance circuit based on a voltage at a first node and the reference voltage;

after the first impedance calibration operation and the second impedance calibration operation are completed, performing, using the first comparator and the second control circuit, a third impedance calibration operation on the third variable impedance circuit based on the voltage at the first node and the reference voltage; and after the third impedance calibration operation is completed, performing, using the first comparator and the first control circuit, a fourth impedance calibration operation on the first variable impedance circuit based on the voltage at the ZQ terminal and the reference voltage.

17. The method of claim 16, wherein:

when the first impedance calibration operation is performed, a first input terminal and a second input terminal of the first comparator are connected to the reference voltage and the ZQ terminal, respectively, an output of the first comparator is provided to the first control circuit, and an impedance of the first variable impedance circuit is adjusted by changing a first impedance calibration code until the voltage at the ZQ terminal becomes equal to the reference voltage, and when the second impedance calibration operation is performed, a first input terminal and a second input terminal of the second comparator are connected to the reference voltage and the first node, respectively, an output of the second comparator is provided to the second control circuit, and an impedance of the third variable impedance circuit is adjusted by changing a second impedance calibration code until the voltage at the first node becomes equal to the reference voltage.

18. The method of claim 17, wherein, when the third impedance calibration operation is performed, the first input terminal and the second input terminal of the first comparator are connected to the reference voltage and the first node, respectively, the output of the first comparator is inverted and an inverted output of the first comparator is provided to the second control circuit, and the impedance of the third variable impedance circuit is adjusted by changing the second impedance calibration code until the voltage at the first node becomes equal to the reference voltage.

19. The method of claim 18, wherein:

when the fourth impedance calibration operation is performed, the first input terminal and the second input terminal of the first comparator are connected to the ZQ terminal and the reference voltage, respectively, the output of the first comparator is provided to the first control circuit, and the impedance of the first variable impedance circuit is adjusted by changing a third impedance calibration code until the voltage at the ZQ terminal becomes equal to the reference voltage, and a final impedance calibration code is generated by averaging the first impedance calibration code and the third impedance calibration code, and the impedance of the first variable impedance circuit is determined based on the final impedance calibration code.

20. An impedance calibration circuit included in a memory device comprising:

a first variable impedance circuit connected to a ZQ terminal;

a second variable impedance circuit and a third variable impedance circuit connected to a first node;

a first comparator configured to compare one of a voltage at the ZQ terminal and a voltage at the first node with a reference voltage;

a second comparator configured to compare the voltage at the first node with the reference voltage;

a first control circuit configured to perform a first impedance calibration operation on the first variable impedance circuit based on an output of the first comparator;

a second control circuit configured to perform a second impedance calibration operation on the third variable impedance circuit based on an output of the second comparator;

a first switch circuit connected to the ZQ terminal and the first node;

a second switch circuit connected to the output of the first comparator, the first control circuit, and the second control circuit;

a third switch circuit configured to connect an output of the first switch circuit to one of a first input terminal and a second input terminal of the first comparator and connect the reference voltage to the other; and a fourth switch circuit connected to the second comparator and the second control circuit, wherein the first impedance calibration operation and the second impedance calibration operation are simultaneously performed, and a third impedance calibration operation on the third variable impedance circuit and a fourth impedance calibration operation on the first variable impedance circuit are sequentially performed after the first impedance calibration operation and the second impedance calibration operation are completed, wherein in the first impedance calibration operation, the first switch circuit and the third switch circuit are configured to connect the first input terminal and the second input terminal of the first comparator to the reference voltage and the ZQ terminal, respectively, the second switch circuit is configured to connect the output of the first comparator to the first control circuit, and the first control circuit is configured to change a first impedance calibration code until the voltage at the ZQ terminal becomes equal to the reference voltage, wherein in the second impedance calibration operation, a first input terminal and a second input terminal of the second comparator are connected to the reference voltage and the first node, respectively, the fourth switch circuit is configured to connect the output of the second comparator to the second control circuit, and the second control circuit is configured to change a second impedance calibration code until the voltage at the first node becomes equal to the reference voltage, wherein in the third impedance calibration operation, the first switch circuit and the third switch circuit are configured to connect the first input terminal and the second input terminal of the first comparator to the reference voltage and the first node, respectively, the second switch circuit is configured to invert an output signal from the output of the first comparator and provide the inverted output signal of the first comparator to the second control circuit, and the second control circuit is configured to change the second impedance calibration code until the voltage at the first node becomes equal to the reference voltage, wherein in the fourth impedance calibration operation, the first switch circuit and the third switch circuit are configured to connect the first input terminal and the second input terminal of the first comparator to the ZQ terminal and the reference voltage, respectively, the second switch circuit is configured to connect the output of the first comparator to the first control circuit, and the first control circuit is configured to change a third impedance calibration code until the voltage at the ZQ terminal becomes equal to the reference voltage, and wherein the first control circuit is configured to further generate a final impedance calibration code by averaging the first impedance calibration code and the third impedance calibration code, and an impedance of the first variable impedance circuit is determined based on the final impedance calibration code.

* * * * *